(12) United States Patent
Iyer et al.

(10) Patent No.: US 11,384,286 B2
(45) Date of Patent: Jul. 12, 2022

(54) GAAS$_{1-x}$SB$_x$ NANOWIRES ON A GRAPHITIC SUBSTRATE

(71) Applicant: North Carolina A&T State University, Greensboro, NC (US)

(72) Inventors: Shanthi Iyer, Greensboro, NC (US); Surya Ratna Kiran Nalamati, Greensboro, NC (US); Jia Li, Greensboro, NC (US)

(73) Assignee: North Carolina A&T State University, Greensboro, NC (US)

( * ) Notice: Subject to any disclaimer, the term of this patent is extended or adjusted under 35 U.S.C. 154(b) by 0 days.

(21) Appl. No.: 17/038,175

(22) Filed: Sep. 30, 2020

(65) Prior Publication Data

US 2021/0095199 A1 Apr. 1, 2021

Related U.S. Application Data

(60) Provisional application No. 62/908,391, filed on Sep. 30, 2019.

(51) Int. Cl.
| | |
|---|---|
| *C09K 11/62* | (2006.01) |
| *C09K 11/75* | (2006.01) |
| *C01B 32/188* | (2017.01) |
| *C30B 29/42* | (2006.01) |
| *C30B 25/16* | (2006.01) |
| *C30B 29/60* | (2006.01) |
| *C30B 29/40* | (2006.01) |
| *C09K 11/74* | (2006.01) |

(Continued)

(52) U.S. Cl.
CPC ............ *C09K 11/62* (2013.01); *C01B 32/188* (2017.08); *C09K 11/7492* (2013.01); *C09K 11/75* (2013.01); *C30B 25/16* (2013.01); *C30B 29/40* (2013.01); *C30B 29/42* (2013.01); *C30B 29/60* (2013.01); *B82Y 20/00* (2013.01); *B82Y 40/00* (2013.01); *C01P 2004/16* (2013.01); *C01P 2004/62* (2013.01); *C01P 2004/64* (2013.01)

(58) Field of Classification Search
CPC ..... C09K 11/62; C09K 11/7492; C09K 11/74; C09K 11/75; C01P 2004/16; C30B 25/16; C30B 29/42; C30B 29/40; C30B 29/60; C30B 25/186; C30B 25/18; C30B 25/04; C30B 25/005
See application file for complete search history.

(56) References Cited

U.S. PATENT DOCUMENTS 10,243,104 B2 * 3/2019 Weman ................. B82Y 40/00

OTHER PUBLICATIONS

Kasanaboina, P. et al., "Self-catalyzed growth of dilute nitride GaAs/GaAsSbN/GaAs core-shell nanowires by molecular beam epitaxy," Applied Physics Letters 107, 2015, p. 103111-1 to 103111-5.

(Continued)

*Primary Examiner* — C Melissa Koslow
(74) *Attorney, Agent, or Firm* — Fox Rothschild LLP

(57) ABSTRACT

The presently disclosed subject matter relates generally to GaAs$_{1-x}$Sb$_x$ nanowires (NW) grown on a graphitic substrate, to methods of growing such nanowires, and to use of such nanowires in applications such as flexible near infrared photodetector.

23 Claims, 14 Drawing Sheets

(51) Int. Cl.
     B82Y 40/00        (2011.01)
     B82Y 20/00        (2011.01)

(56) References Cited

OTHER PUBLICATIONS

Araki, Y., et al., "Growth of dilute nitride GaAsN/GaAs heterostructure nanowires on Si substrates," Nanotechnology, 24(6), 2013, p. 065601 (7 pages).

Bharatan, S., et al., "The effects of annealing on the structural, optical, and vibrational properties of lattice-matched Ga As Sb N/Ga As grown by molecular beam epitaxy," Journal of Applied Physics, 102(2), 2007, p. 023503-1 to 023503-9.

Buyanova, A., et al., "Mechanism for low-temperature photoluminescence in GANAs/GaAs structures grown by molecular-beam epitaxy," Applied Physics Letters, 75(4), 1999, p. 501-503.

Carron, R., et al., "Dilute nitride InGaAsN/GaAs V-groove quantum wires emitting at 1.3 μm wavelength at room temperature," Applied Physics Letters, 99(10), 2011, p. 101107-1 to 101107-3.

Chen, S. L., et al., "Origin of radiative recombination and manifestations of localization effects in GaAs/GaNAs core/shell nanowires." Applied Physics Letters, 105(25), 2014, p. 253106-1 to 253106-5.

Chen, S.L., et al., "Suppression of non-radiative surface recombination by N incorporation in GaAs/GaNAs core/shell nanowires," Scientific Reports, 5, 2015, p. 11653 (9 pages).

Ghalamestani, S.G., et al., "Self-catalyzed MBE grown GaAs/GaAsxSb1-x core-shell nanowires in ZB and WZ crystal structures," Nanotechnology, 24(40), 2013, p. 405601 (6 pages).

Harmand, J.C, et al., "GaNAsSb: How does it compare with other dilute III-V-nitride alloys?" Semiconductor Science and Technology, 17(8), 2002, p. 778-784.

Iyer S, et al., Chapter 3: A Study of Ga-Assisted Growth of GaAs/GaAsSb Axial Nanowires by Molecular Beam Epitaxy, Nanoscience and Nanoengineering: Advances and Applications (CRC Press)(2014), p. 31-50, ISBN 9781482231199.

Ma, L., et al., "Bandgap-engineered GaAsSb alloy nanowires for near-infrared photodetection at 1.31 μm," Semiconductor Science and Technology, 30(10), 2015, p. 105033 (6 pages).

Sukrittanon, S., et al., "Growth and characterization of dilute nitride GaNxP1-x nanowires and GaNxP1-x/GaNyP1-y core/shell nanowires on Si (111) by gas source molecular beam epitaxy," Applied Physics Letters, 105(7), 2014, p. 072107-1 to 072107-5.

Treu, J., et al., "Lattice-matched InGaAs—InAlAs core-shell nanowires with improved luminescence and photoresponse properties," Nano Letters, 15, 2015, p. 3533-3540.

Bian, L.F., et al., "Photoluminescence characteristics of GaAsSbN/GaAs epilayers lattice-matched to GaAs substrates," Solid State Communications, vol. 132, No. 10, 2004, p. 707-711.

Ungaro, G., et al., "GaAsSbN: a new low-bandgap material for GaAs substrates." Electronics Letters, vol. 35, No. 15, 1999 (2 pages).

Tomioka, K., et al., "GaAs/AlGaAs Core Multishell Nanowire-Based Light-Emitting Diodes on Si," Nano Letters, vol. 10, No. 5, 2010, p. 1639-1644.

Ghalamestani, S., et al., "Self-catalyzed MBE grown GaAs/GaAsxSb1-x core-shell nanowires in ZB and WZ crystal structures." Nanotechnology, vol. 24, No. 40, 2013, p. 405601 (6 pages).

Huet, B., et al., "Fundamental Limitations in Transferred CVD Graphene Caused by Cu Catalyst Surface Morphology," Carbon, 163, 2020, p. 95-104.

* cited by examiner

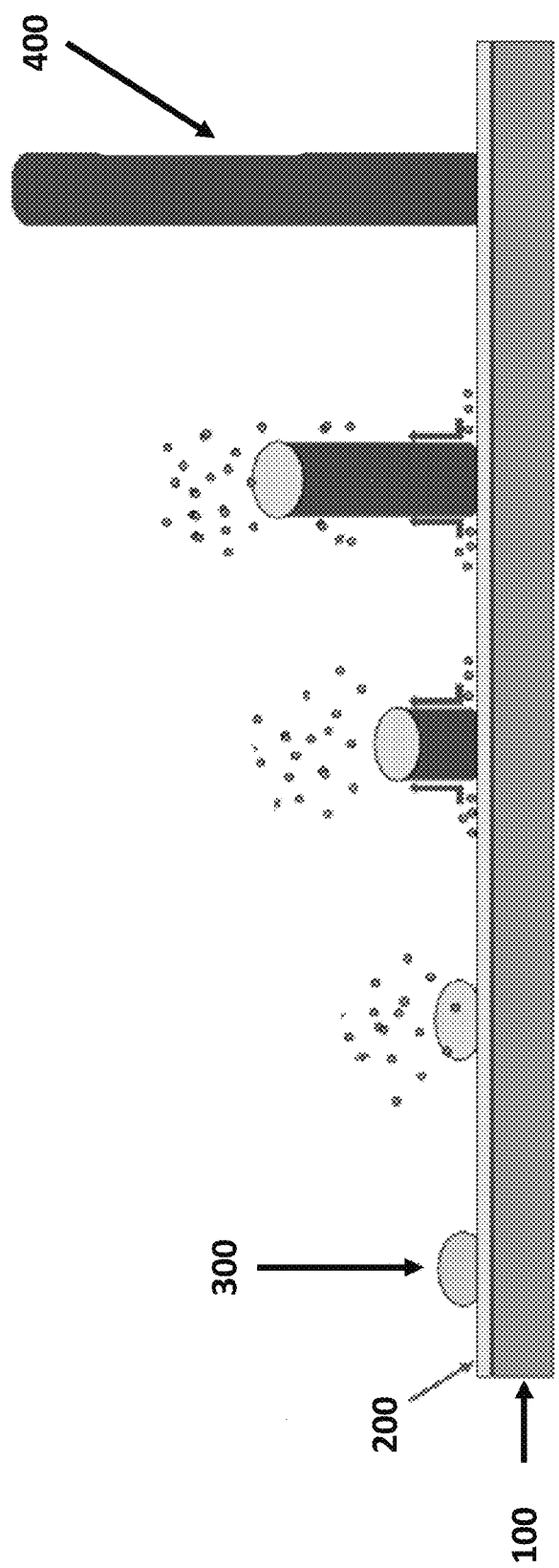

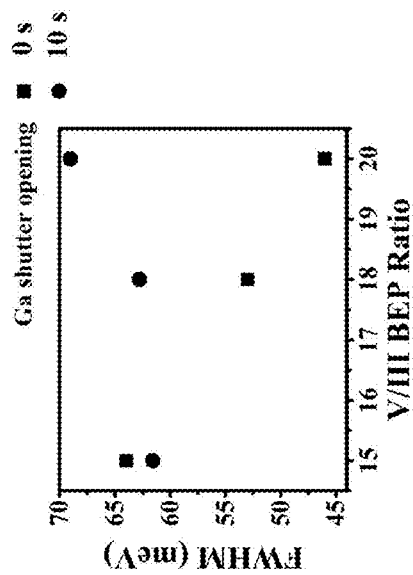
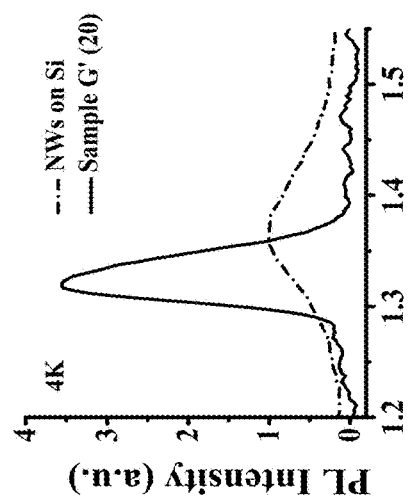
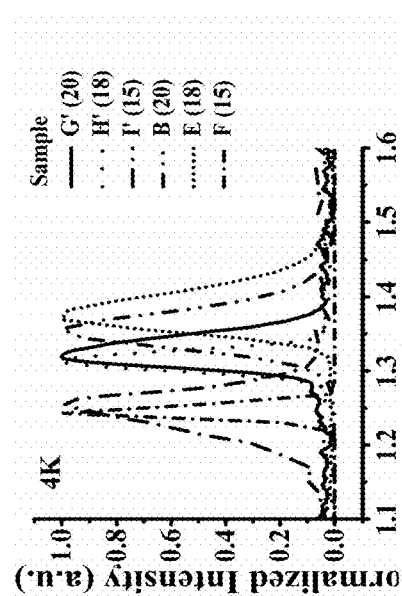
Figure 6C
Figure 6B
Figure 6A

GAAS$_{1-x}$SB$_x$ NANOWIRES ON A GRAPHITIC SUBSTRATE

CROSS REFERENCE TO RELATED APPLICATIONS

This application claims priority pursuant to 35 U.S.C. § 119(e) to U.S. Provisional Patent Application Ser. No. 62/908,391 filed on Sep. 30, 2019, which is hereby incorporated by reference in its entirety.

STATEMENT AS TO RIGHTS TO INVENTIONS MADE UNDER FEDERALLY SPONSORED RESEARCH OR DEVELOPMENT

This invention was made with Government support under N00014-16-1-2720 awarded by the Office of Naval Research. The Government has certain rights in this invention.

TECHNICAL FIELD

The presently disclosed subject matter relates generally to nanowires (NWs) including gallium (Ga), arsenic (As) and antimony (Sb) grown on a graphitic substrate, such as, for example, GaAs$_{1-x}$Sb$_x$ nanowires; methods of growing such nanowires on a graphitic substrate; and methods of using such nanowires. The presently disclosed subject matter furthers photodetector (PD) devices capable of use in the near-infrared (NIR) region employing NWs.

BACKGROUND

One-dimensional (1D) semiconductor NWs can be building blocks for nanophotonic integrated devices, due to their superior light trapping characteristics and high crystal quality. Heterogeneous integration of NWs with a two dimensional (2D) material provides an excellent platform for flexible device growth, due to their weak van der Waal interactions, and offers cost effective opportunities for a broad range of advanced generation flexible optoelectronic device applications, such as aerial infrared tracking, night vision, wearable devices, mobile applications, medical detection, and petroleum exploration.

Semiconductor nanowires are of interest due to their large aspect ratio, which enables relaxation of lattice mismatch constraints, and enhanced light trapping features. This offers unique opportunities to integrate nanophotonic devices, such as Group III-V compound semiconductors, with electronic devices on a silicon (Si) platform. Among Group III-V NWs, nanowires including Gallium (Ga), Arsenic (As) and/or Antimony (Sb) have attracted considerable attention, due to their high absorption coefficient, superior carrier mobility characteristics, as well as a bandgap tunability of from 870 nm (gallium arsenide (GaAs)) to 1700 nm (gallium antimonide (GaSb)).

The ability of Group III-V NWs to tolerate larger mismatch offers an opportunity to integrate these NW materials with 2D materials. Graphene shows exceptional electrical, mechanical and optical properties, while being cost-effective and relatively easy to produce. Epitaxial growth on graphene occurs via weak van der Waal forces, in contrast to the epitaxial growth of NW via strong covalent bonding with traditional substrates (e.g. Si or GaAs). Graphene's low surface energy, which is two orders of magnitude lower than conventional NW substrates such as Si and GaAs, poses a significant challenge to growing NWs on its surface. In particular, the growth of high-yield vertical semiconductor NWs on graphene faces challenges due to: (i) the small bond length of graphene compared to Group III-V semiconductor materials, (ii) differences in the adsorption energies of the Group III-V constituents on different sites of the graphene lattice, and (iii) the chemically inert nature of graphene, corresponding to a low surface energy, and resulting in the formation of droplets with a large contact angle that is not conducive to vertical NW growth. Hence, there are few reports on the growth of semiconductor NWs of any composition on graphene.

Accordingly, nanowires on a graphitic substrate, and particularly ternary nanowires including Ga, As, and Sb grown on a graphitic substrate, as well as methods of growing such nanowires, are still desired.

SUMMARY

The present disclosure provides nanowires (NWs) including gallium (Ga), arsenic (As) and antimony (Sb); GaAs$_{1-x}$Sb$_x$ nanowires grown on a graphitic substrate; methods of growing such nanowires on a graphitic substrate; and methods of using such nanowires.

A first aspect of the disclosure provides a composition containing at least one nanowire formed from GaAs$_{1-x}$Sb$_x$, wherein x ranges from 0.05 to 0.5; and wherein the nanowire is grown on a graphitic substrate. In some embodiments, the at least one nanowire is an axial nanowire and includes a stem region wherein x is between 0.3 and 0.5; and an upper region wherein x is between 0.05 and 0.2. In some embodiments, the nanowire upper region contains an n-dopant. In some embodiments, the n-dopant is selected from the group of tellurium, tin, silicon, selenium, or sulfur; in some embodiments, the n-dopant is tellurium. In some embodiments, the nanowire exhibits an average 4K photoluminescence (PL) emission of at least about 1.19 eV or at least about 1.24 eV, in some embodiments the emission is between about 1.24 eV and about 1.38 eV. In some embodiments, the nanowires of the present disclosure exhibit an average room temperature PL emission of at least about 1.25 eV, or at least about 1.3 eV. In some embodiments, the at least one nanowire is a plurality of nanowires that is present in an array of nanowires. In some embodiments, all or substantially all of the nanowires are vertically aligned or substantially vertically aligned in the array. In some embodiments, the nanowires have an average diameter of from 50 nm to 400 nm or of from 60 nm to 250 nm. In some embodiments, the nanowires have an average length of from 50 nm to 10 μm or have an average length of at least about 1 μm. In some embodiments, the nanowires have an average aspect ratio of from 5 to 500. In some embodiments, the nanowires have an average radius of curvature that is from 5 to 1000 times the average length of the nanowires. In some embodiments, the graphitic substrate is graphene or a derivative thereof. In some embodiments, the graphene is monolayer graphene or a derivative thereof; in other embodiments, the graphene is multilayer graphene or a derivative thereof. In some embodiments, the graphitic substrate is supported on a layer of silica, silicon, copper, nickel, or platinum. In some embodiments, the graphitic substrate is supported on an SiO$_2$/Si layer. In some embodiments, the SiO$_2$/Si layer is a SiO$_2$/p-Si (111) layer. In some embodiments, the nanowire has a passivating layer. In some embodiments, the passivating layer is GaAs. In some embodiments, the passivating layer covers at least about 75% of the nanowire.

A second aspect of the disclosure provides an optoelectronic device including at least one nanowire according to the first aspect of the disclosure.

A third aspect of the disclosure provides a method of preparing a plurality of nanowires on a graphitic substrate, including the steps of: subjecting a graphitic substrate to a plasma treatment, optionally an oxygen plasma treatment; baking the plasma treated graphitic substrate; performing a molecular beam epitaxy using a flux of Ga atoms, to create a plurality of Ga droplets; and performing a molecular beam epitaxy using fluxes of each of Ga, As and Sb atoms, to grow a plurality of nanowire structures including $GaAs_{1-x}Sb_x$. In some embodiments, the growth of the nanowire is assisted by a Ga catalyst that is, wherein the growth is self-catalyzed. In some embodiments, each of the nanowire structures is an axial nanowire structure and the molecular beam epitaxy growth occurs during a first and a second stage. In some variations, the first stage is conducted at a temperature of between 500° C. and 550° C. or between 520° C. and 540° C., and the second stage is conducted at a temperature of between 575° C. and 615° C. or between 580° C. and 610° C. In some embodiments, substantially all of the nanowire structures are oriented vertically on the graphitic substrate. In some embodiments, the graphitic substrate is graphene or a derivative thereof; in some embodiments, the graphitic substrate is monolayer graphene or a derivative thereof. In some embodiments, the method further includes the step of depositing the graphitic substrate, optionally a graphene monolayer, on a $SiO_2/Si$ layer. In some embodiments, the plasma treatment of the graphitic substrate uses anoxygen ($O_2$), ozone ($O_3$), argon (Ar), chlorine ($Cl_2$), or fluorine ($F_2$) gas plasma treatment. In some embodiments, the graphitic substrate is baked at a temperature ranging from 80° C. to 200° C., for a period of time of from 2 to 8 hours. In some embodiments, the method further includes growing a passivating layer on all or substantially all of the nanowire structures. In some embodiments, the passivation layer includes GaAs or AlGaAs. In other embodiments, the passivation layer includes GaAs. In some embodiments, the passivating layer covers at least about 75% of a nanowire structure. In some embodiments, the nanowire $GaAs_{1-x}Sb_x$ structure is an axial nanowire and has a substantially constant x between 0.05 and 0.2. In some embodiments, x is about 0.07 or about 0.1. In some embodiments, the $GaAs_{1-x}Sb_x$ nanowire structure is an axial nanowire and includes a stem region wherein x is between 0.3 and 0.5; and an upper region wherein x is between 0.05 and 0.2. In some embodiments, the method further includes the step of n-doping an upper region of the $GaAs_{1-x}Sb_x$ nanowire structure. In some embodiments, the upper region is optionally n-doped with tellurium (Te). In some embodiments, the n-dopant is tellurium (Te), tin (Sn), silicon (Si), selenium (Se), sulfur (S), or a combination thereof. In some embodiments, the plurality of nanowire structures on the graphitic substrate have a density of at least about 1.8 $\mu m^{-2}$ or at least about 4 $\mu m^{-2}$ or at least about 7 $\mu m^{-2}$ or at least about 10 $\mu m^{-2}$.

These and other embodiments are described in greater detail in the detailed description which follows. An object of the presently disclosed subject matter having been stated hereinabove, and which is achieved in whole or in part by the presently disclosed subject matter, other objects will become evident as the description proceeds when taken in connection with the accompanying drawings as best described herein below.

BRIEF DESCRIPTION OF THE DRAWINGS

FIG. 1 illustrates a scheme for the growth process of $GaAs_{1-x}Sb_x$ NWs on monolayer graphene on a $SiO_2/p$-Si (111) substrate.

FIG. 6A illustrates low-temperature (4K) normalized photoluminescence (PL) spectra of $GaAs_{1-x}Sb_x$ NWs for Ga shutter opening duration of simultaneous opening of all shutters (sample G' (20), sample H' (18) and sample I' (15)) and opening for 10 s (sample B (20), sample E (18) and sample F (15)) for corresponding V/III BEP ratios of 15, 18 and 20.

FIG. 6B illustrates 4K $\mu$-PL spectra of single $GaAs_{1-x}Sb_x$ NW grown on graphene and silicon.

FIG. 6C illustrates a plot of full-width half maxima versus V/III BEP ratio for Ga shutter opening durations of 0 and 10 s.

DETAILED DESCRIPTION

Figure 2B:
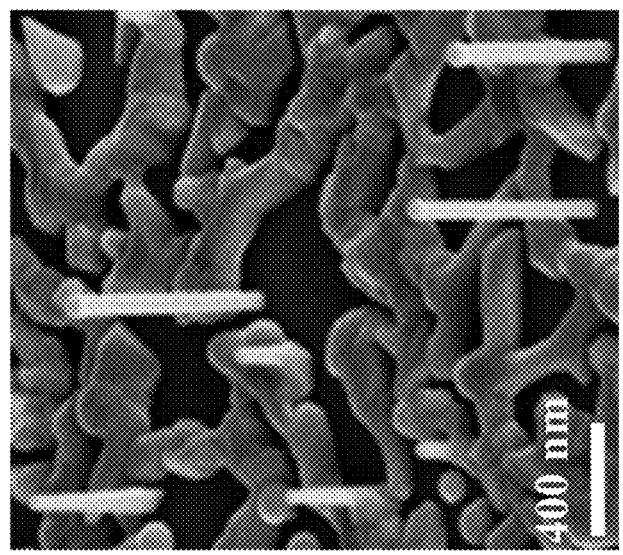
FIG. 2B illustrates an SEM image of the surface morphology of $GaAs_{1-x}Sb_x$ axial NWs for Tg1 at 540° C. and Tg2 at 580° C.

The presently disclosed subject matter will now be described more fully. The presently disclosed subject matter can, however, be embodied in different forms and should not be construed as limited to the embodiments set forth herein below and in the accompanying Examples. Rather, these embodiments are provided so that this disclosure will be thorough and complete, and will fully convey the scope of the embodiments to those skilled in the art.

All references listed herein, including but not limited to all patents, patent applications and publications thereof, and scientific journal articles, are incorporated herein by reference in their entireties to the extent that they supplement, explain, provide a background for, or teach methodology, techniques, and/or compositions employed herein.

I. Definitions

While the following terms are believed to be well understood by one of ordinary skill in the art, the following definitions are set forth to facilitate explanation of the presently disclosed subject matter.

Unless defined otherwise, all technical and scientific terms used herein have the same meaning as commonly understood to one of ordinary skill in the art to which the presently disclosed subject matter belongs.

Following long-standing patent law convention, the terms "a" and "an" refer to "one or more" when used in this application, including the claims.

The term "and/or" when used in describing two or more items or conditions, refers to situations where all named items or conditions are present or applicable, or to situations wherein only one (or less than all) of the items or conditions is present or applicable.

The use of the term "or" in the claims is used to mean "and/or," unless explicitly indicated to refer to alternatives only, or the alternatives are mutually exclusive, although the disclosure supports a definition that refers to only alternatives and "and/or."

As used herein "another" can mean at least a second or more.

The term "comprising", which is synonymous with "including," "containing," or "characterized by" is inclusive or open-ended and does not exclude additional, unrecited elements or method steps. "Comprising" is a term of art used in claim language which means that the named elements are essential, but other elements can be added and still form a construct within the scope of the claim.

As used herein, the phrase "consisting of" excludes any element, step, or ingredient not specified in the claim. When the phrase "consists of" appears in a clause of the body of a claim, rather than immediately following the preamble, it limits only the element set forth in that clause; other elements are not excluded from the claim as a whole.

As used herein, the phrase "consisting essentially of" limits the scope of a claim to the specified materials or steps, plus those that do not materially affect the basic and novel characteristic(s) of the claimed subject matter.

With respect to the terms "comprising", "consisting of", and "consisting essentially of", where one of these three terms is used herein, the presently disclosed subject matter can include the use of either of the other two terms.

As used herein, the term "about", when referring to a value is meant to encompass variations of in one example ±20% or ±10%, in another example ±5%, in another example ±1%, and in still another example ±0.1% from the specified amount, as such variations are appropriate to practice the disclosed inventions.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

All ranges disclosed herein are also to be considered to include the end points of the range, unless expressly stated otherwise. For example, a range of "between 5 and 10", "from 5 to 10" or "5-10" should generally be considered to include the end points 5 and 10.

Further, when the phrase "up to" is used in connection with an amount or quantity, it is to be understood that the amount is at least a detectable amount or quantity. For example, a material present in an amount "up to" a specified amount can be present from a detectable amount and up to and including the specified amount.

As used herein, "nanowire" refers to an anisotropic wire-like structure. Nanowires are essentially one-dimensional with nanometer dimension in width or diameter of 1-1000 nm, including for example 1-500 nm or 1-300 nm. The length of nanowires are typically in the range of a few 100 nm to up to 10 μm. Nanowires can have an aspect ratio of at least 2, at least 5, at least 10, at least 50, at least 100, at least about 250, or at least about 500. It is further to be understood that a nanowire described herein can be cylindrical or substantially cylindrical. A nanowire described herein can also be faceted, as opposed to having a continuously curved circumference.

As used herein "axial nanowire" refers to a nanowire containing the active components in an axial configuration (e.g. axially stacked). As disclosed herein, in some embodiments $GaAs_{1-x}Sb_x$ axial nanowires have a uniform Sb content, wherein x is between about 0.05 and 0.2, such as, for example, 0.07. In other embodiments, $GaAs_{1-x}Sb_x$ axial nanowires have a stem where x is between 0.3 and 0.5 and an upper region where x is between 0.05 and 0.2. The 'stem region' is generally the 'bottom' of the nanowire, i.e. the area of the nanowire that is adjacent to the substrate; the 'upper region' is generally that area of the nanowire that is not adjacent to the substrate and is at the 'top' of the nanowire, relative to the substrate being the 'bottom.'

As disclosed herein, the NW of the present disclosure are grown on a graphitic substrate. Graphitic substrates include, but are not limited to graphene or derivatives thereof, such as graphene oxide or graphane. Graphene includes a single layer of graphene (monolayer graphene) or multiple layers of graphene (multilayer graphene) or derivatives thereof. The term "monolayer" refers to a layer that is one atom thick; multilayer graphene refers to more than one layer of graphene, such as 5 layers, 10 layers, or more.

In some embodiments, the nanowires disclosed herein are coated with a passivation layer, which passivates the surface states of the nanowire, wherein the passivation layer includes a material having a higher band gap compared to $GaAs_{1-x}Sb_x$ NW. In some embodiments, the passivating layer optionally includes GaAs, where the NWs disclosed herein are passivated by growing a GaAs layer over the $GaAs_{1-x}Sb_x$ nanowires. The passivation layer generally exemplified herein is GaAs, but those of skill in the art can prepare passivation layers having different compositions, including, but not limited to AlGaAs. In some embodiments, the GaAs or AlGaAs layer is grown by a vapor-solid technique. In some embodiments, passivated axial nanowires grown on graphene as disclosed herein exhibit photoluminescence emission at 1.35 eV at 4K, and 1.28 eV at room temperature.

The passivation layer generally surrounds (or covers or "overcoats") or substantially surrounds (or covers or "overcoats") the nanowires. As understood by one of ordinary skill in the art, a passivation layer that "surrounds" or "substantially surrounds" (or "covers" or "substantially covers" or "overcoats" or "substantially overcoats") the nanowire can surround or substantially surround (or cover or substantially cover or overcoat or substantially overcoat) the circumference of the nanowire, such that the layer surrounds or substantially surrounds (or covers or overcoats) the nanowire radially. The layer may also surround or substantially surround (or cover or substantially cover or overcoat or substantially overcoat) the nanowire on the ends or faces of the nanowire longitudinally (i.e., at the ends of the "length" or "long dimension" of the nanowire). Additionally, the passivation layer can surround (or cover or overcoat) at least about 75%, at least about 80%, at least about 85%, at least about 90%, at least about 95%, at least about 98%, or at least about 99% of the relevant surface or surfaces of the nanowire, based on area. Thus, in some cases, the passivation layer completely or substantially completely surrounds, covers, or overcoats the nanowire.

In some embodiments, the nanowires are vertically aligned or substantially vertically aligned, relative to the substrate on which the nanowires are disposed or grown, where the "vertical" direction corresponds to a direction perpendicular to the surface of the substrate. As used herein, the phrase "substantially vertically aligned" refers to an orientation of a plurality of anisotropic objects (e.g., nanowires) in a population of the objects, wherein at least about 60 percent, at least about 70 percent, at least about 80 percent, or at least about 90 percent of the objects (e.g., nanowires) of the population have a vertical or substantially vertical orientation. A "vertical orientation" refers to an orientation wherein the long axis of an anisotropic object (e.g., a nanowire) forms an angle ($\theta$) of less than about 30 degrees, less than about 15 degrees, or less than about 10 degrees with a vertical line or direction described herein.

Similarly, anisotropic objects that are "substantially aligned" without reference to a specific direction (e.g., a vertical direction) of alignment are aligned with reference to an average orientation or direction of alignment of the population of anisotropic objects. Further, at least about 60 percent, at least about 70 percent, at least about 80 percent, or at least about 90 percent of the objects (e.g., nanowires) of the population have an orientation or alignment wherein the long axis of the anisotropic object (e.g., a nanowire) forms an angle ($\theta$) of less than about 30 degrees, less than about 15 degrees, or less than about 10 degrees with an average orientation or direction described hereinabove.

An "array" of objects (e.g., nanowires), as used herein, refers to a group of the objects on a surface. An "ordered" array refers to an array in which the arrangement of the objects within the array follows a pattern or substantially follows a pattern (i.e., within 20%, within 10%, or within 5% deviation from the pattern). For example, the objects of an "ordered" array can be arranged in regularly spaced rows and columns. The "density" of an array refers to the percentage of the area of the surface that is occupied by the objects of the array (as opposed to being vacant or occupied by some other item).

II. Nanowires on Graphitic Substrates

The present disclosure relates to compositions including one or more nanowires on graphitic substrates. Nanowires have a variety of uses, for example, they may be used in optoelectric devices.

The nanowires are formed from gallium (Ga), arsenic (As) and antimony (Sb), according to the formula $GaAs_{1-x}Sb_x$, where x ranges from about 0.05 to about 0.5.

In some embodiments, the $GaAs_{1-x}Sb_x$ nanowires grown on a graphitic substrate are axial nanowires having a substantially uniform concentration of antimony, where x is between 0.05 and 0.2, or is about 0.1, or is between 0.06 and 0.085, or is about 0.07. In some embodiments, the $GaAs_{1-x}Sb_x$ nanowires grown on a graphitic substrate are axial nanowires having a stem where x is between 0.3 and 0.5 and an upper region where x is between 0.05 and 0.2. In some embodiments, x in the stem is about 0.4 and x in the upper region ranges from 0.05 to 0.1. In some embodiments, the $GaAs_{1-x}Sb_x$ nanowires grown on a graphitic substrate are prepared with an n-type dopant, such as, for example, a tellurium (Te), tin (Sn), silicon (Si), selenium (Se), or sulfur (S) dopant; in some embodiments, the n-type dopant is Te. In some embodiments, the n-type dopant is present in the upper region of the axial nanowire. In some embodiments, the axial nanowire has a passivation layer, which can optionally be GaAs.

In some embodiments, the composition includes an array of axial $GaAs_{(1-x)}Sb_x$ nanowires grown on a graphitic substrate, optionally including a passivating layer and/or n-type doping. For example, in some embodiments, the nanowires exhibit an average 4K photoluminescence emission of between about 1.24 eV and about 1.38 eV. In some embodiments, the axial nanowires in the array exhibit a sharp 4K PL emission peak at 0.94 μm (1.319 eV) with an FWHM of 46 meV. In some embodiments, the nanowires of the present application exhibit an average 4K photoluminescence emission of at least about 1.35 eV and an emission of 1.3 eV at room temperature In some embodiments, the array is an ordered array, such as an array in which the nanowires are arranged in regularly spaced rows and columns. Further, in some embodiments, the nanowires of an array are aligned. For example, in some embodiments, at least one, or at least some of the nanowires are vertically aligned or substantially vertically aligned, where the "vertical" direction corresponds to a direction perpendicular to the surface of the substrate on which the nanowires are disposed, e.g. graphene or derivative thereof. In some embodiments, all, or substantially all of the nanowires are vertically aligned. Additionally, in some embodiments, the array of nanowires has a high nanowire density. For instance, in some embodiments, the nanowires occupy at least about 40%, at least about 50%, at least about 60%, at least about 70%, at least about 80%, or at least about 90% of the surface of the substrate, e.g. graphene or derivative thereof, on which the nanowires are disposed. In some embodiments, the nanowires occupy 40-100%, 40-90%, 40-80%, 40-70%, 50-100%, 50-90%, 50-80%, 50-70%, 60-100%, 60-90%, 60-80%, 70-100%, or 70-90% of the surface of the substrate, e.g. graphene or derivative thereof, on which the nanowires are disposed.

As described above, the nanowire is formed from Ga-$As_{(1-x)}Sb_x$. It is to be understood that the value of x (i.e., the antimony content) is determined herein according to scanning transmission electron microscope (STEM) energy-dispersive x-ray spectroscopy (EDS) analysis. Analysis by Raman spectroscopy corroborated that measurement.

It is further to be understood that nanowires described herein can have any total dimensions not inconsistent with the objectives of the present disclosure. For example, in some embodiments, the nanowires have an average diameter of 50-400 nm, 50-300 nm, 60-250 nm, or 60-200 nm. Further, in some embodiments, the nanowires have an average length of at least 500 nm, at least 1 μm, at least 2 μm, at least 5 μm, or at least 10 μm. In some instances, the nanowires have an average length of 500 nm-10 μm, 500 nm-5 μm, 500 nm-2 μm, 50 nm to 10 μm, 1-10 μm, 1-5 μm, or 1-2 μm. Additionally, in some embodiments, the nanowires have an aspect ratio of at least about 2, at least about 5, at least about 10, at least 20, at least 50, at least 100, or at least 500. In some embodiments, the axial nanowires have an aspect ratio of 2-500, 5-100, 10-50, 10-20, 20-500, 20-100, 20-50, 50-500, 50-100.

Moreover, in some embodiments, axial nanowires described herein having a high aspect ratio also have a straight or substantially straight morphology, as opposed to a curved morphology. In some embodiments, the nanowires have an average radius of curvature that is at least 5 times the average length of the nanowires. In some embodiments, the nanowires have an average radius of curvature of at least 10, at least 20, at least 50, at least 100, at least 500, or at least 1000 times the average length of the nanowires. In some embodiments, the axial nanowires have an average radius of curvature that is 5-1000, 5-500, 5-100, 5-50, 10-1000, 10-500, 10-100, 10-50, 50-1000, 50-500, or 50-100 times the average length of the nanowires.

Additionally, nanowires can have any combination of sizes and shapes not inconsistent with the objectives of the present disclosure. For example, in some embodiments, the nanowires of the present application grown on a graphitic substrate have an average diameter of 60 nm-250 nm, an average length of about 120 nm-2 μm or 50 nm to 10 μm, or a length up to about 5 μm. In some variations, the nanowires have an average aspect ratio of at least 2, and an average radius of curvature of at least 5 times the average length of the nanowires. In some embodiments, the nanowire grown on a graphitic substrate has an average length of at least 0.8 μm, an average aspect ratio of at least 10, and an average radius of curvature of at least 5 times the average length of the axial nanowires. Other combinations of sizes and shapes are also possible.

Moreover, in some embodiments, an array or other population of axial nanowires described herein is homogeneous, or substantially homogeneous, in at least one of size, shape, or composition. For instance, in some embodiments, the nanowires of a population or array described herein have a size distribution (in diameter, length, and/or aspect ratio) of 15% or less, 10% or less, or 5% or less, where the percentage is based on two standard deviations from a mean size. In some embodiments, the full width at half maximum (FWHM) of the peak photoluminescence (PL) emission of a population or array of nanowires differs from the FWHM of the peak PL emission of a single nanowire of the population or array by less than 20 meV, less than 15 meV, less than 10 meV, or less than 5 meV.

Nanowires described herein offer various advantages compared to other semiconductor structures. For example, the so-called "one-dimensional" (1D) structure of nanowires offers flexibility in band-gap engineering, material design architecture, and a wide choice of substrates, which have made nanowires an attractive candidate for a variety of device applications in the nanoscale. Due to the small nanowire footprint on the substrate, the substrate can accommodate large lattice and thermal expansion coefficient mismatch between the NW and the substrate. NWs thus enable the integration of different material combinations on a wide range of substrates. Since the diameter, but not the length of NW is constrained, charge carriers generated within the NW are confined in two dimensions, while the carriers freely propagate in the third (length) dimension of the NW. This manifests in a high density of electronic states, leading to electrical, optical and magnetic properties quite different from bulk and thin film counterparts. Additionally, the presence of a large surface-to-volume ratio leads to lowering of the barrier for chemical reaction and higher defect tolerance.

The 1D geometry of nanowires offers advantages over thin films, such as for example, at least one of better stress-strain management, increased defect tolerance, reduced reflection, enhanced light trapping and improved band gap tuning. Additionally, NW geometry enhances the light-matter interaction through better light trapping and improved antireflection characteristics, compared to its thin film counterpart. Moreover, the use of NWs facilitates the assembly of multifunctional components on the same substrate, and thereby enables the hybrid integration of driver electronics and detectors on the same chip. Such systems can be used in parallel with existing sensing technologies in areas such as chemical/biological sensing, environmental monitoring, imaging, and information processing. For example, photonic circuits can be assembled from a collection of nanowire elements that offer various functions, such as light creation, routing, and detection.

NW arrays are suited to meet the demands of the next generation electronic and optoelectronic devices, such as light emitting diodes, solar cells, photodetectors, lasers, gas sensors, and imaging, with high prospects for improving detection limits and spatial resolution.

The nanowires are grown on a graphitic substrate. In some embodiments, the graphitic substrate is a graphene monolayer. The graphitic substrate can be made by any suitable method. For example, in some embodiments, the graphitic substrate is synthesized by catalytic chemical vapor deposition (CVD).

As disclosed herein, plasma treatment improved adhesion of the nanowires to the graphitic substrate. In some embodiments, plasma treatment is conducted using a radio frequency power of from 1 W to 4 W, for a duration of from 10 s to 45 s. In some embodiments, the graphitic substrate is subjected to a plasma treatment, optionally an oxygen plasma treatment. In some embodiments, the graphitic substrate is subjected to an oxygen plasma treatment. In some embodiments, the plasma treatment is conducted under a flow of oxygen, ozone, argon, chlorine, or fluorine. In some embodiments, a flow rate of between about 20 sccm and about 80 sccm is used. In some embodiments, the flow rate is between about 40 sccm and about 60 sccm. In some embodiments, the flow rate is about 50 sccm. In some embodiments, the flow rate is held substantially constant during plasma treatment. In some embodiments, the oxygen plasma treatment is conducted under a pressure and duration of 1 W for 45 s, 2 W for 25 s or 4 W for 16 s.

It was unexpectedly discovered that vertical, high-quality nanowires containing gallium (Ga), arsenic (As) and antimony (Sb) can be grown with good density on oxygen ($O_2$) plasma-treated graphene by self-catalyzed molecular beam epitaxy. In some embodiments, the graphitic substrate is subjected to oxygen ($O_2$) plasma treatment before performing molecular beam epitaxy, enabling modification of the surface functionalization and improved reactivity of the graphitic surface to semiconductor adatoms. Raman spectroscopy, conductive atomic force microscopy (C-AFM), or X-ray photoelectron spectroscopy (XPS) can be used to evaluate the $O_2$ plasma treatment induced level of disorder, e.g. structural defects such as point defects, and functionalization of the graphitic surface. In some embodiments, the $O_2$ plasma treatment is conducted under mild conditions, low power and duration of $O_2$ plasma treatment. In some embodiments the graphitic substrate is supported on any substrate that can withstand the NW growth conditions and is inert, such as for example semiconductor substrates or transparent glasses. Such supporting substrates can include, but are not limited to, silicon (Si), silica ($SiO_2$), copper (Cu), nickel (Ni) or platinum (Pt). The substrate itself can be supported on a silicon wafer, e.g. silica/silicon ($SiO_2$/Si) substrate or Ni/Si substrate or on an oxidized silicon wafer, such as Ni/$SiO_2$ or Cu/$SiO_2$. In some embodiments, the $SiO_2$/Si substrate is $SiO_2$/p-Si (111).

In some embodiments, the plasma treated graphitic substrate is baked prior to growing the nanowire via molecular beam epitaxy. In some embodiments, the baking temperature ranges from 80° C. to 200° C. In some embodiments, the baking duration ranges from 2 hours to 8 hours.

In some embodiments, the plurality of nanowires on the graphitic substrate have a density of at least 1.8 $\mu m^{-2}$, or at least 4 $\mu m^{-2}$; in some embodiments the density is at least 7 $\mu m^{-2}$ or at least 10 $\mu m^{-2}$.

As disclosed herein, nanowires are grown on the graphitic substrate by self-catalyzed molecular beam epitaxy using a flux of gallium atoms as the catalyst. The gallium adsorbs on the graphitic substrate and congregates forming a plurality of Ga droplets (FIG. 1). The initial Ga flux may take place over a suitable period of time to provide the desired droplet diameter. In some embodiments, the initial gallium flux is conducted for a period of time of from 0 to 15 seconds, generally no more than 10 seconds. A flux of arsenic, antimony and gallium is then provided to begin the nanowire growth using the Vapor-Liquid-Solid growth technique. The Ga, As and Sb fluxes, initiated simultaneously or not, as disclosed in the Examples, are controlled such that the composition of the nanowire structures is $GaAs_{1-x}Sb_x$. During the growth process, the Ga, As and Sb atoms enter the Ga droplets, migrate to the bottom of the Ga droplets, and begin growing the nanowire, layer by layer. The Ga, As and Sb fluxes are discontinued once the desired nanowire length has been achieved.

Under the proper growth conditions, all, or substantially all of the nanowires grow in a vertical or substantially vertical orientation on the graphitic subtrate. The growing conditions can be controlled to minimize or prevent the growth of horizontal or non-vertical nanowires. In some embodiments, the nanowires are grown under a consistent temperature. It was unexpectedly discovered that vertical nanowire yield is improved when the nanowire growth temperature is varied. In some embodiments, the first stage of axial nanowire growth is conducted at a temperature of from 500° C. to 550° C., or from 520° C. to 540° C., followed by a second stage of axial nanowire growth at a temperature of from 575° C. to 615° C., or from 580° C. to 610° C. In some embodiments, the first stage of axial nanowire growth is conducted for a period of time of from 3 to 12 minutes. In some embodiments, the second stage of axial nanowire growth is conducted for a period of time of from 5 to 40 minutes. In some embodiments, the passivation layer, optionally GaAs, is grown via Vapor Solid Liquid Technique. In some variations, the growth temperature ranges from 445° C. to 485° C. or from 455° C. to 475° C. In some variations, the V/III BEP ratio ranges from 10 to 30, or from 15 to 25. Generally the growth duration of the passivation layer is proportional to the targeted thickness of the layer and in some embodiments, ranges from 2 min to 10 min.

In some embodiments, the lower portion, or stem region, of the NWs have a higher Sb concentration than the upper portion of the axial NW. The higher Sb concentration provides for surface engineering the graphitic surface via the surfactant effect of the Sb, and better lattice matching. Antimony's surfactant nature affects the wettability of the low surface energy graphitic surface and modifies the contact angle of the Ga droplets. Increasing the Sb concentration enables both a good contact angle of the growing droplet containing Ga, As and Sb atoms, and vertical NW growth; and a higher Sb concentration at the nucleation step reduces the lattice mismatch with graphene. In some embodiments, the higher Sb concentration stem region of the axial NW has an Sb concentration such that x is at least 0.3 in $GaAs_{1-x}Sb_x$. In some embodiments, the stem region of the axial NW has an Sb concentration such that x is at between 0.3 and 0.5, or about 0.4. The upper portion, or upper region of the axial nanowires can have the same or a different Sb concentration. In some embodiments, the upper portion of the nanowire has a lower Sb composition, where x is no more than 0.2 or is between 0.05 and 0.2, or is about 0.1. In some embodiments, the axial nanowire stem is $GaAs_{0.6}Sb_{0.4}$, and the axial nanowire upper portion is $GaAs_{0.9}Sb_{0.1}$. It was unexpectedly discovered that making nanowires having a higher Sb concentration on a graphene substrate that has been subjected to an $O_2$ plasma treatment leads to a significant improvement in vertical axial NW yield, and the growth of a relatively high Sb composition stem on $O_2$ plasma-treated graphene on $SiO_2$/p-Si (111) leads to dense accumulations of vertical axial NWs. In some embodiments, NWs made by this method have a nanowire density on the graphitic substrate of between 1.8 $\mu m^{-2}$ and about 9 $\mu m^{-2}$ or between about 4 $\mu m^{-2}$ and about 7 $\mu m^{-2}$.

In some embodiments, an upper portion of the axial nanowires grown on a graphitic substrate is n-doped; in some embodiments, the n-dopant is tellurium (Te), tin (Sn), silicon (Si), selenium (Se), or sulfur (S); in some embodiments, the n-dopant is tellurium (Te). In some embodiments, the n-doping is conducted using a GaTe cell; in other embodiments the n-doping is conducted using a Sn, Si, Se or S source known to those of skill in the art. In some embodiments, devices fabricated with axial NWs n-doped exhibit an optical responsivity of 110 A/W at 900 nm, with a detectivity of about $1.1 \times 10^{14}$ Jones.

As shown herein NWs of the present disclosure grown on a graphitic substrate, such as, but not limited to monolayer graphene with n-doping and/or a passivating layer, such as GaAs, exhibit room temperature photoluminescence, however those without n-doping or a passivating layer do not.

In some embodiments, the nanowires exhibit an average 4K photoluminescence emission of between about 1.24 and about 1.38 eV. In some embodiments, at least one single nanowire exhibits a sharp 4K photoluminescence (PL) emission peak at 0.94 $\mu m$ (1.319 eV) with a full width at half maximum (FWHM) of 46 meV.

The axial NWs grown under the conditions disclosed herein exhibited a zinc blende (ZB) crystal structure with few to no discernible structural defects. A high level of detectivity can be achieved by a photodetector made of the nanowires of the disclosure. In some embodiments, an axial NW photodetector including a passivating layer, a high Sb concentration stem, and low Sb concentration upper region, as described above, generally exhibits a detectivity of from about $10^{10}$ to about $10^{14}$ Jones.

As described further herein below, axial nanowires described herein can be made in any manner not inconsistent with the objectives of the present disclosure. The nanowires may especially advantageously be made by molecular beam epitaxy (MBE), including solid source plasma assisted MBE.

EXAMPLES

The following Examples have been included to provide guidance to one of ordinary skill in the art for practicing representative embodiments of the presently disclosed subject matter. In light of the present disclosure and the general level of skill in the art, those of skill can appreciate that the following Examples are intended to be exemplary only and that numerous changes, modifications, and alterations can be employed without departing from the scope of the presently disclosed subject matter.

Example 1

Graphene was grown via a catalytic chemical vapor deposition (CVD) reaction on 99.8% copper (Cu) foil. Before growth, the surface of the copper was cleaned with semiconductor grade acetone, isopropyl alcohol (IPA), deionized water (DI) and acetic acid, followed by an $H_2$ etch at 1000° C. to ensure a clean surface prior to introducing $CH_4$ as the graphene source. Growth occurred in a horizontal hot-wall furnace heated to 1050° C., at a pressure of 1 Torr. The temperature and pressure were maintained during the hydrogen anneal before growth, followed by the introduction of $CH_4$ as the carbon source to initiate growth. The Cu foil cooled naturally in an Ar/$H_2$ environment after the growth of single-layer graphene (SLG) of 100 mm (+/−0.3) diameter. The graphene was vacuum sealed immediately after growth and coated with polymethylmethacrylate (PMMA) in a cleanroom environment to reduce the risk of particle contamination prior to transfer.

The Cu was etched using CE-100 $FeCl_3$ Cu etchant, followed by DI water rinse, 10% HCl rinse, and a final DI water rinse (15 min each). Pristine single-layer graphene (SLG) of 100 mm (+/−0.3) diameter was transferred using a wet transfer method onto 15 nm thick $SiO_2$ (grown by thermal oxidation on a p-Si (111) substrate and purchased form UniversityWafer, South Boston, Mass.). The root mean square (RMS) surface roughness of $SiO_2$ was ~1 nm. The transferred sample was baked at 50° C. for 4 hrs and then 10 min at 150° C. to remove any moisture between the film and substrate. The PMMA was stripped with the acetone and IPA, and the sample was baked another 30 min at 50° C. to dry. Just before loading into the MBE entry chamber, the transferred SLG on $SiO_2$/p-Si (111) was rinsed with acetone and dried using $N_2$. The sample was further baked in high vacuum ($1 \times 10^{-6}$ to $7 \times 10^{-7}$ Torr) in the entry chamber of the MBE system at 200° C. for 8 hrs.

The growth of $GaAs_{1-x}Sb_x$ axial NWs was carried out using $As_4$ and $Sb_2$ as the Group-V constituent sources and a Hot Lip SUMO cell for the Ga Source (Veeco, Plainview, N.Y.). The growth schematic is shown in FIG. 1, wherein graphene layer, 200, was coated on the $SiO_2$/Si substrate, 100, and the growth described herein ultimately yielded a GaAsSb NW, 400. The growth was initiated at a lower-growth temperature in the range 520° C.-550° C. by opening the Ga shutter, yielding a Ga droplet, 300, followed by opening the As and Sb shutters, wherein droplets of each of Ga, As and Sb added to the growth of the nanowire on graphene. The growth temperature was immediately increased to 580° C.-610° C. for a growth duration of 5 min. For growth conditions, Ga, As and Sb beam equivalent pressure (BEP) of $1 \times 10^{-7}$ Torr, $1.8 \times 10^{-6}$ Torr, and $2 \times 10^{-7}$ Torr, respectively, for a V/III BEP ratio of 20 were used. The temperature of the Ga effusion cell was pre-set to yield a nominal planar GaAs growth rate of 0.5 ML/s for Ga BEP of $1 \times 10^{-7}$ Torr with the As cracker valve cell position set for the desired flux. For other BEP ratios, the Group V flux was varied by keeping the Ga BEP invariant.

Scanning electron microscopy (SEM) was performed using a Carl Zeiss Auriga-BU Focused Ion Beam (FIB) field emission scanning electron microscope (FESEM). X-ray diffraction (XRD) were completed using a Bruker D8 discover instrument with a DaVinci diffractometer in the standard Bragg-Brentano parafocusing configuration. Scanning transmission electron microscopy (STEM) and energy dispersive x-ray spectroscopy (EDS) characterization were performed on an aberration-corrected (probe) FEI Titan G2 system. Selected area diffraction (SAED), and high-resolution transmission electron microscopy (HRTEM) were performed on a JEOL 2010F microscope operated at 200 kV. Optical measurements included μ-photoluminescence (μ-PL) using a 633 nm He—Ne laser as the excitation source with a 0.32 m double grating monochromator for wavelength dispersion and an InGaAs detector for detection using a conventional lock-in amplifier. A closed-cycle optical cryostat from Montana Cryostation with the sample chamber interfaced with a fiber-coupled confocal microscope was used for μ-PL measurements at 4K. The sample was dissolved in isopropanol, sonicated for 100 s and further dispersed on rhodium flashed copper grid 150 mesh and 3.05 mm O.D. These NW samples were then used for single nanowire (SNW) PL measurements described below. Raman spectroscopy was performed in a Horiba Jobin Yvon ARAMIS Raman microscope with a He—Ne laser (633 nm) excitation source at room temperature. Surface topography measurements were performed by tapping mode in Agilent LS 5600 atomic force microscopy (AFM) and Si probes were used at a resonant frequency of 190 KHz with an image scanning speed of 0.2 lines/s. Current sensing atomic force microscopy (CSAFM) was performed for obtaining I-V characteristics from a single NW on the grown substrate using the aforementioned AFM. A Pt/Ir coated Si cantilever of radius ~20 nm and spring constant of 0.2 N/m was used. The AFM probe was grounded and the voltage was supplied to the substrate. A tungsten carbide electrode was clamped on the surface of the substrate before imaging. Initially, Z-image and conductive mapping over an area of 20 μm×20 μm ensemble NWs was completed. By choosing the appropriate setpoint and other scanning parameters, NWs were identified by circles in Z-image. I-V spectroscopy was performed by placing the AFM tip on the highlighted circles. Two Helium-Neon lasers with wavelengths of 633 nm and 673 nm and power densities of ~5 W/cm$^2$ and ~0.1 kW/cm$^2$, respectively, were used for optical illumination.

Finite element modeling (FEM) of the NW was performed using Comsol Multiphysics software with Poisson's and ambipolar transport equations to obtain the electric potential and the carrier concentrations at each simulation point to extract the electrical transport parameters from the best fit of the simulated data to the experimental I-V characteristics. The nanowire was modeled in 2D axisymmetric dimension as a 2D rectangle with cylindrical symmetry. Dimensions of the NWs were taken from SEM measurements.

Results and Discussion

An AFM tapping mode topography analysis of the wrinkle-free surface of the monolayer graphene transferred on the SiO$_2$/Si, exhibited a root mean square roughness of ~0.4 nm and a step height of ~3 nm to the graphene surface. The graphene was polycrystalline and the average grain size was 1-2 microns. The size of PMMA residues on graphene was typical (~1-2 μm). These may have limited the adatom diffusion but were not expected to alter significantly the NW growth and interface properties. The techniques developed for complete removal of PMMA residues on transferred graphene had their own limitations. However, the low intensity of Raman D-peak (vide infra) indicated the absence of an unusual high density of defects in graphene.

The effects of a two-step growth temperature approach, variation of V/III BEP ratio, and Ga shutter opening duration on the NW growths were evaluated. Table 1 identifies the samples and associated growth conditions.

TABLE 1

Growth parameters and associated nomenclature of the GaAs$_{1-x}$Sd$_x$ NWs grown on graphene/SiO$_2$/p-Si (111) substrate.

| Sample | Tg1 (° C.) | Tg2 (° C.) | V/III BEP ratio | Ga shutter opening time (s) |
|---|---|---|---|---|
| A | 520 | 580 | 20 | 10 |
| B (20) | 540 | 580 | 20 | 10 |
| C | 550 | 580 | 20 | 10 |
| D | 540 | 610 | 20 | 10 |
| E (18) | 540 | 580 | 18 | 10 |
| F (15) | 540 | 580 | 15 | 10 |
| G' (20) | 540 | 580 | 20 | 0 |
| H' (18) | 540 | 580 | 18 | 0 |
| I' (15) | 540 | 580 | 15 | 0 |
| J' (25) | 540 | 580 | 25 | 0 |

Figure 2A:
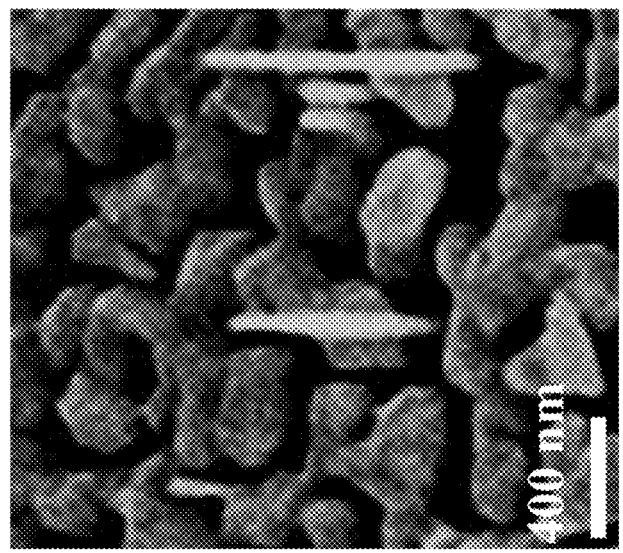
FIG. 2A illustrates a scanning electron microscope (SEM) image of the surface morphology of $GaAs_{1-x}Sb_x$ axial NWs for Tg1 at 520° C. and Tg2 at 580° C.
Figure 2D:
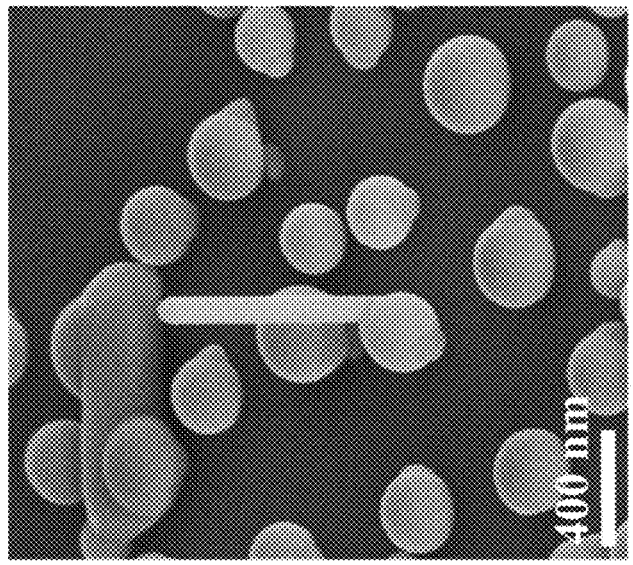
FIG. 2D illustrates an SEM image of the surface morphology of $GaAs_{1-x}Sb_x$ axial NWs for Tg1 at 540° C. and Tg2 at 610° C.
Figure 2C:
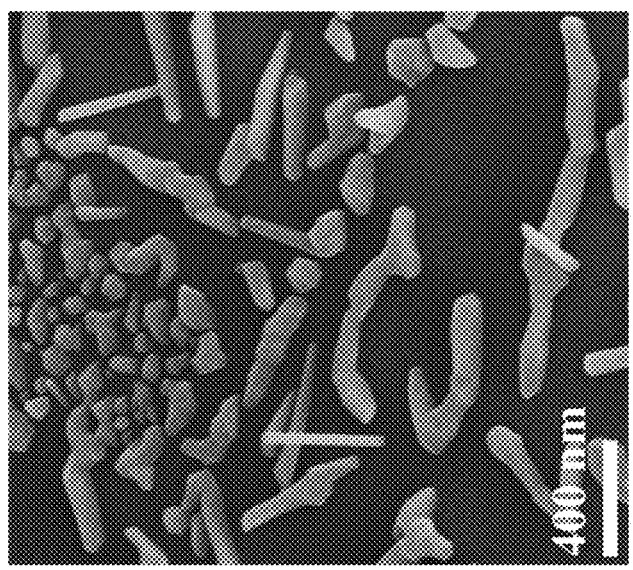
FIG. 2C illustrates an SEM image of the surface morphology of $GaAs_{1-x}Sb_x$ axial NWs for Tg1 at 550° C. and Tg2 at 580° C.

In the two step-growth approach, initial substrate temperatures (Tg1) from 520° C. to 550° C., representing the initiation of GaAsSb NW growth, were examined. The temperature was gradually increased during growth to a higher temperature (Tg2) of 580° C. For these growths, a V/III BEP ratio of 20 with a Ga shutter opening duration of 10 s before growth was used. The NWs grown at Tg1 (520° C.) exhibited non-uniform length (FIG. 2A), whereas an increase in Tg1 to 540° C. yielded NWs of well-defined hexagonal symmetry with an increase in both axial and radial growth rates and NW density (FIG. 2B). A further increase in Tg1 to 550° C. showed an adverse effect on the growth rate and NW density with an increase in "crawling" NWs (FIG. 2C). Without being bound by theory, this is attributed to an increase in the Ga adatom diffusion length with growth temperature and a higher probability of the Ga adatom occupying the unfavorable B or T sites. Parasitic growth was enhanced with an increase in Tg1, attributed to non-wetting of the Ga-droplet.

Figure 2F:
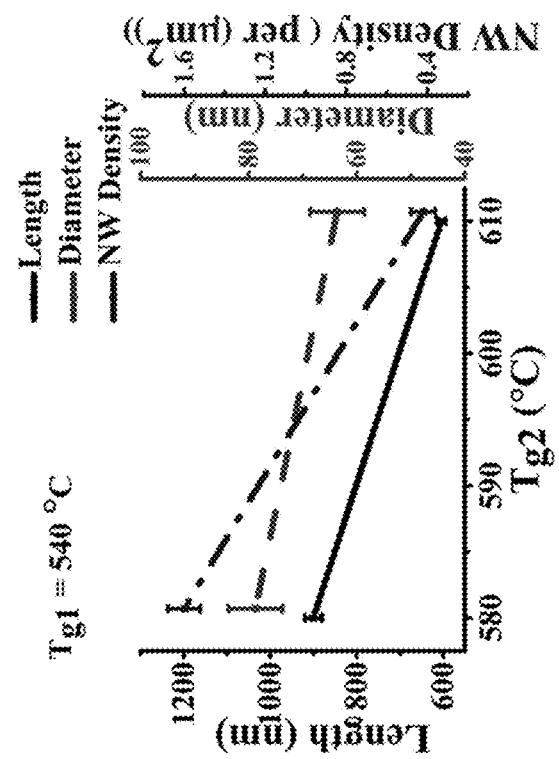
FIG. 2F illustrates the change in NW length (solid line), diameter (dashed line), and density (dash-dot line) with change in Tg2 when Tg1 is 540° C. The error bars represent the extrema of the measurements taken from 20 vertical NWs.
Figure 2E:
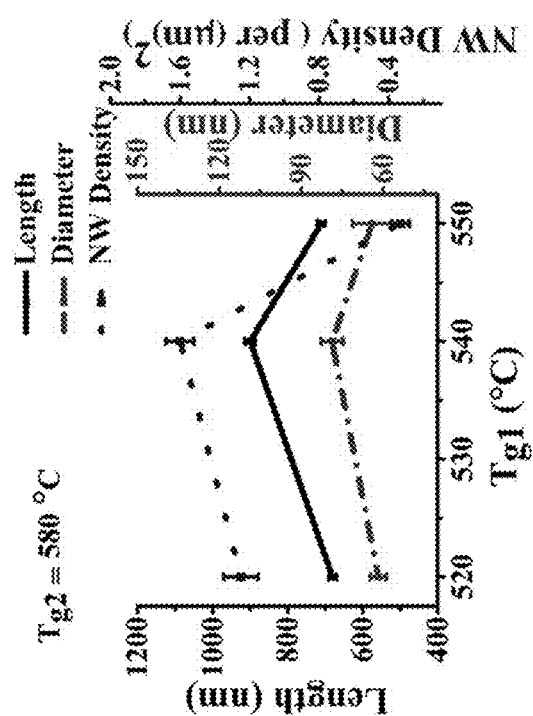
FIG. 2E illustrates the change in NW length (solid line), diameter (dashed line), and density (dash-dot line) with change in Tg1 when Tg2 is 580° C. The error bars represent the extrema of the measurements taken from 20 vertical NWs.

With an initial growth temperature Tg1 of 540° C., the influence of Tg2 (580° C. and 610° C.) on growth rate and NW density was investigated. An increase in Tg2 to 580° C. led to well-faceted NWs with some parasitic growth (FIG. 2B). A further increase in Tg2 to 610° C. yielded short NWs with very low density and large Ga-droplets on the surface with no other visible parasitic growth (FIG. 2D). These trends are summarized graphically in FIGS. 2E and 2F.

Figure 3B:
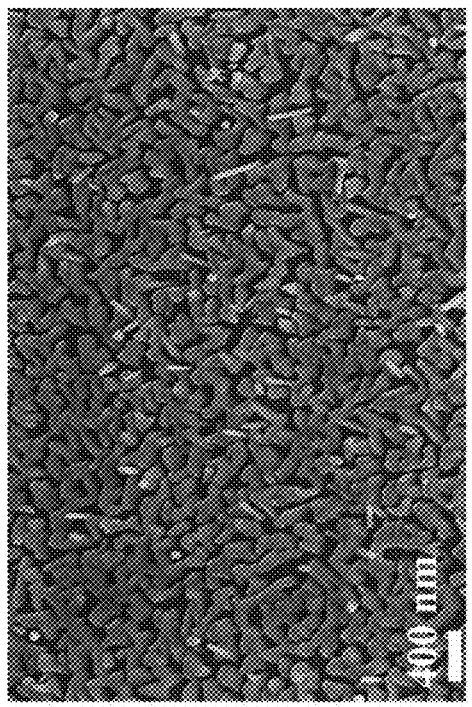
FIG. 3B illustrates an SEM image of $GaAs_{1-x}Sb_x$ NWs on graphene/$SiO_2$/p-Si (111) at a growth temperature of 540° C.
Figure 3A:
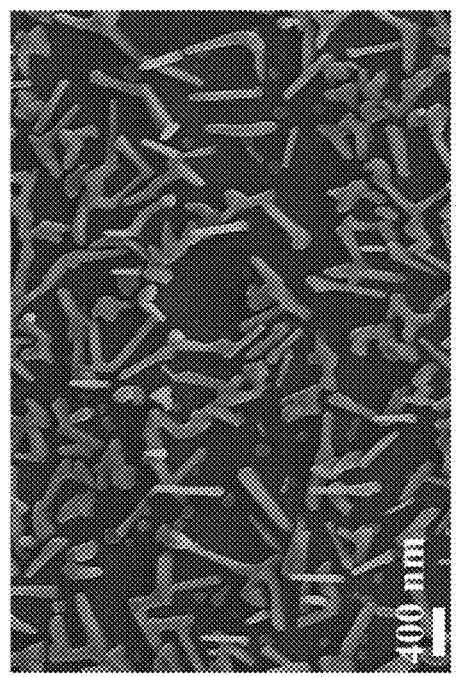
FIG. 3A illustrates an SEM image of $GaAs_{1-x}Sb_x$ NWs on graphene/$SiO_2$/p-Si (111) at a growth temperature of 520° C.
Figure 3D:
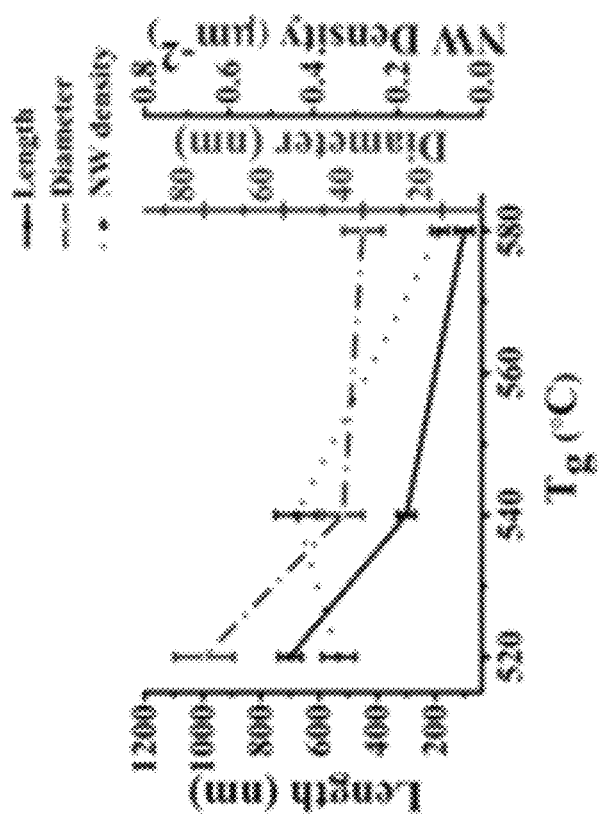
FIG. 3D illustrates the change in $GaAs_{1-x}Sb_x$ NW length (solid line), diameter (dash dot line), and density (dotted line) with change in growth temperature (Tg). The error bars represent the maximum deviation based on measurements taken from 20 vertical NWs.
Figure 3C:
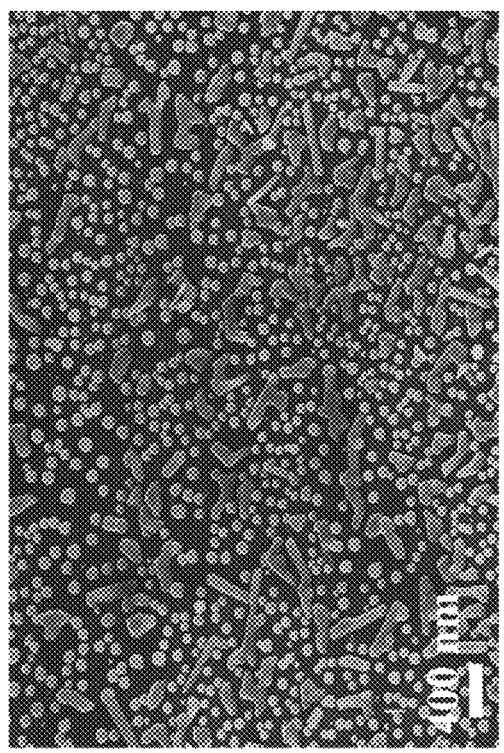
FIG. 3C illustrates an SEM image of $GaAs_{1-x}Sb_x$ NWs on graphene/$SiO_2$/p-Si (111) at a growth temperature of 580° C.

The two temperature process was adopted with the lower temperature promoting nucleation while the NW growth occured predominantly at the higher growth temperature, Tg2. Growth at a single temperature ranging from 520° C. to 580° C. resulted in nonvertical and crawling NWs with thick parasitic growth (FIG. 3A: 520° C.; FIG. 3B: 540° C.; FIG. 3C: 580° C.), in contrast to the NW growth commonly observed on Si substrates, where a higher temperature is used for nucleation. NW growth at different temperatures was graphed (FIG. 3D). Without being bound by theory, it is possible that high Ga diffusion on graphene compared to Si substrate contributes to this reversal of growth temperature. When evaluating the initial stages of the Ga droplets deposited on graphene and (111) Si using the respective optimized growth conditions, before turning on the Group V flux, SEM images showed that Ga droplets of ~60 nm diameter were uniformly dispersed on the Si substrate, while larger diameters of ~80 nm Ga droplets on the line boundaries of graphene were observed of significantly lower density.

Lower temperature decreased the diffusion of Ga and its desorption from graphene, thus when opening simultaneous shutters, the nucleation rate was increased. The droplet shape and the contact angle may thus have been more suitable for vertical NW growth. With an increase in temperature, triple phase line of the droplet was maintained within the NW geometry by the impinging Group V flux, leading to a continuation of the NW growth. Enhanced Ga desorption at higher growth temperature minimized parasitic growth. A complete dewetting of the droplet with the substrate and lack of any parasitic growth was observed for Tg1 of 540° C. and Tg2 of 610° C. (FIG. 2D).

Figure 4:
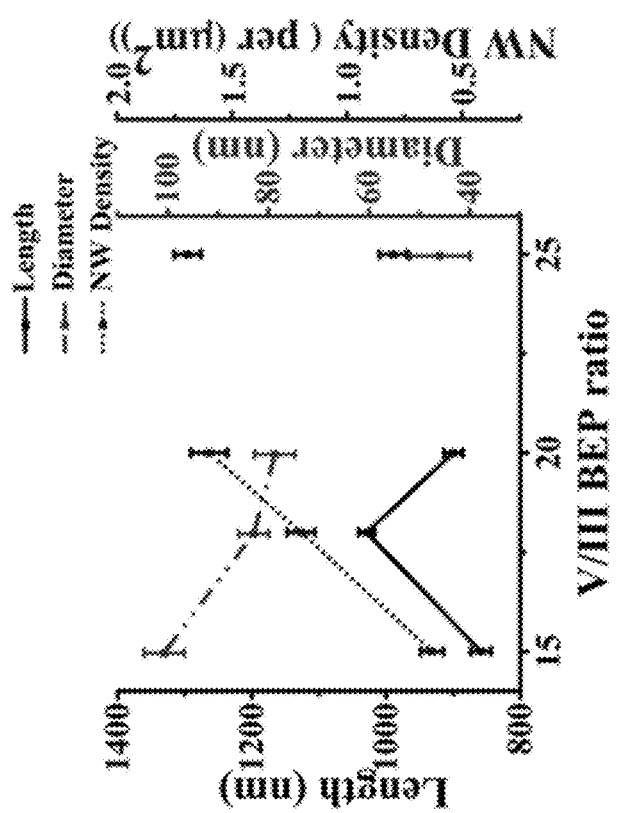
FIG. 4 illustrates the change in $GaAs_{1-x}Sb_x$ NW length (solid line), diameter (dash dot line), and density (dotted line) with change in V/III BEP ratio. The error bars represent the extrema of the measurements taken from 20 vertical NWs.

Using the values of the substrate temperatures Tg1 (540° C.) and Tg2 (580° C.) determined above, the influence of variation in the V/III BEP ratio (15, 18 and 20) on NW density with the Ga shutter opening maintained at 10 s prior to growth was explored. Lowering the V/III BEP ratio resulted in oversized Ga droplets manifesting in shorter NWs with a larger diameter and promoting the formation of horizontal growth (FIG. 4). The NW density was also reduced (FIG. 4). A V/III BEP ratio of 20 resulted in a high density of nucleation sites being successfully translated to vertical NW growth due to an abundant supply of group-V adatoms consuming the Ga-droplet. The ratio of 20 yielded the best results with an optimum Ga droplet shape, which was further confirmed by increasing the V/III BEP ratio to 25, which resulted in a reduced density of NWs along with an increase in the aspect ratio from ~11 corresponding to V/III BEP ratio of 20 to 18.

Figure 5:
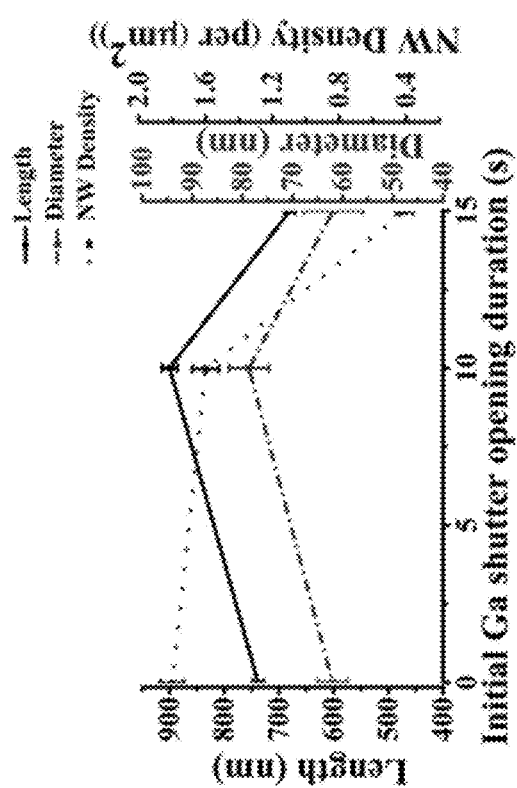
FIG. 5 illustrates the change in $GaAs_{1-x}Sb_x$ NW length (solid line), diameter (dash dot line), and density (dotted line) with change in Ga shutter opening durations. The error bars represent the extrema of the measurements taken from 20 vertical NWs.

The effects of Ga shutter opening duration (15, 10 and 0 s) were investigated using an V/III BEP ratio of 20. Since the Ga shutter opening is a parameter that influences the droplet size during the initial stages of growth, the decrease in NW density for 15 s duration was attributed to the agglomeration of the droplets leading to a reduction in the number of droplets available for nucleation. Lowering the Ga shutter opening from 10 s to simultaneous opening of the shutters resulted in reduced diameter of the NW from 70 nm to 60 nm and improved vertical NW density from ~1.6/µm$^2$ to ~1.8/µm$^2$. Without being bound by theory, these observations suggest that the droplet size was reduced with reduction in the contact angle, promoting vertical NW density. This, in turn, led to variation in the Group V species interception with the droplet, as well as the degree of supersaturation and Sb incorporation. The change in length, diameter and NW density with variation in Ga shutter opening duration was graphed (FIG. 5). Continuous parasitic growth was observed along the boundary lines of the graphene, suggesting NWs were not grown on the non-graphene or oxide areas.

Sample G'(20) was evaluated using TEM, as well as HRTEM; selected area electron diffraction (SAED) patterns confirmed the zinc-blende (ZB) structure of the GaAsSb NWs. Microtwins and stacking faults were observed only near the NW tip and as faint satellite spots observed in the corresponding SAED pattern. Without being bound by theory, the occurrence of these structural irregularities at the tip was attributed to the concurrent closing of all the shutters during the termination of the Ga droplet, which yielded an As-rich Ga droplet with the wurtzite structure of the NW being more favored, leading to creation of these planar defects. False-color high-angle annular dark-field imaging (HAADF) TEM imaging and corresponding EDS compositional line scans revealed uniform compositional homogeneity along the NW with an Sb composition of 7.3 atomic %. Thus the nanowires can be characterized as $GaAs_{0.927}Sb_{0.073}$, or more generally $GaAs_{0.9}Sb_{0.1}$.

The droplet offset, that is the growth of the droplet along the surface of the substrate is the origin of horizontal and crawling NWs grown on graphene. Without being bound by theory, a round top may indicate that having the Ga droplet completely cover the NW tip leads to vertical nanowires.

X-ray diffraction spectra of NWs for three different V/III BEP ratios under simultaneous opening of Ga, As and Sb shutters (sample G'(20)) and with a 10 s Ga opening, V/III=20 (sample B (20)) revealed the existence of only GaAsSb (111) and Si (111) Bragg peaks attesting to the vertical alignment of NWs. The shift in the GaAsSb (111) Bragg peak with respect to that of $GaAs_{1-x}Sb_x$ NWs (similar Sb composition) grown on Si with the same V/III BEP ratio shifted toward a lower angle with a decreased Ga opening duration, as well as with a decreasing V/III BEP ratio, indicating increased Sb alloying. The growth conditions of V/III BEP ratio of 20 with simultaneous opening of shutters were found to lead to the highest Sb incorporation compared to other growth conditions. The contribution of parasitic growth to the XRD spectra was ruled out by comparing exclusively with the XRD of the parasitic growth with no NWs.

The 4K PL spectra of a single NW (SNW) grown under optimized growth conditions corresponding to V/III BEP ratio of 20 with simultaneous opening of all shutters (sample G'(20)) exhibited a well-defined sharp PL peak energy at 1.32 eV with a FWHM of 46 meV, while a NW grown at a V/III BEP ratio of 20 and a Ga shutter opening duration of 10 s (sample B (20)) exhibited a PL energy peak at 1.35 eV with an FWHM of 69 meV (FIG. 6A). Without being bound by theory, the sharp peak of the PL spectra with simultaneous opening of all shutters indicates compositional homogeneity of NWs grown via smaller Ga droplets. The PL spectra exhibited a redshift of ~137 meV with a decrease in the V/III BEP ratio from 20 to 15, irrespective of the Ga shutter opening. Without being bound by theory the large redshifts observed on graphene were likely associated with Sb-induced modulation of the droplet size. Antimony acted as a surfactant, impacting the migration length of Ga and lowering the contact angle of the Ga droplet due to the lowering of the surface energy of Ga droplet. The lower migration energy of Sb and its nature of riding on the surface due to its surfactant effect enhanced the probability of interaction with Ga, favoring Ga—Sb bonding more than Ga—As bonding, which would promote higher incorporation of Sb in the NWs. The reduction in the contact angle due to Sb had a favorable influence on the droplet shape, which otherwise may have resulted in a large contact angle on the graphene due to the low surface energy of the substrate, making it unsuitable for vertical NW growth. Glancing angle SEM images of Ga droplets on Si and graphene substrate revealed contact angles to be ~90° and ~120°, respectively; the droplet on graphene exhibited asymmetric shape.

Also, GaAsSb droplets before the nucleation of NW for a 60 s shutter opening duration at a growth temperature of 540° C. suggests that the desired droplet contact angle for vertical NW growth was ~120°. Opening all the shutters simultaneously not only assisted in the Sb-induced reshaping of the droplet to establish a favorable contact angle for growth but also assisted rapid consumption of the droplet, promoting successful growths of smaller droplets with high growth rates. High Ga adatom mobility on the graphene likewise contributes to the observed high growth rate, smaller droplets, and diminished nucleation sites as compared to those commonly observed on Si for similar Sb composition. The surface engineering via Sb addressed above also explains the relatively high vertical NW density that was obtained with simultaneous opening of the shutter conditions as well as higher (~2x) vertical NW density (1.8/µm$^2$) in GaAsSb NWs. This trend in NW density with Sb incorporation was in contrast to that observed for NWs grown on a Si substrate, where Sb incorporation adversely affected the NW density, which further attests to the effect of the Sb surfactant effect.

A comparison of the 4K PL spectra of GaAsSb NW grown on graphene with those grown on Si (FIG. 6B) for similar PL peak energy grown under optimized conditions (optimized conditions being different from NWs grown on Si) showed that the NW grown on graphene (sample G'(20)) exhibited a 3-fold higher intensity with lower FWHM of 46 meV compared to 152 meV for nanowires grown on Si (FIG. 6C). Without being bound by theory, the higher PL intensity observed from NWs grown on graphene may have been due to better compositional homogeneity as well as a reduction in point defects. The low migration energy, relatively smooth surface of graphene due to lack of a significant parasitic layer, and the diminished surfactant effect of Sb on reducing the adatom mobility of Ga may have contributed to a relatively high Ga diffusion on graphene, leading to a reduction in the concentration of point defects, namely the Ga antisite/Ga vacancy complex defect commonly present in these alloys. The EDS data showed evidence of uniform composition.

Room temperature (RT) Raman spectra of GaAsSb NW growth on graphene exhibited peaks at 260.7 cm$^{-1}$ and 282.2 cm$^{-1}$, which correspond to the transverse optical and longitudinal optical phonon modes, respectively. An additional peak was observed for both optimized growth conditions (sample (G'(20)) and Ga opening duration of 10 s (sample B (20)), at around 230 cm$^{-1}$, which corresponded to a GaSb-like transverse optical (TO) mode. The observation of graphene-related 2D and G Raman peaks at 1581 cm$^{-1}$ and 2674 cm$^{-1}$, respectively, and the ratio of their peaks I2D/IG>1 in Raman spectra on graphene samples before and after growth, indicated monolayer graphene underneath the NWs. The Raman peak intensity at 1350 cm$^{-1}$ related to the D mode of graphene near the noise level in both of these samples attested to minimal defects in the graphene layer.

The current sensing atomic force microscopy (CSAFM) technique was used to measure the current-voltage (I-V) characteristics of a single vertical GaAsSb NW grown on graphene as well as on Si. The NWs grown on graphene exhibited photoresponse of few nA/W to few μA/VV, depending on the bias voltage and illumination power. Those for NWs on graphene were consistently close to an order of magnitude higher than observed for NWs grown on Si, and exhibited significantly lower dark current in the pA range. The best fit of a simulated I-V curve to experimental data under dark conditions for NWs grown on graphene yielded an electron mobility (μn) of 182 cm$^2$V$^{-1}$ s$^{-1}$, a hole mobility (μp) of 53 cm$^2$V$^{-1}$ s$^{-1}$ and a carrier concentration of 5.3× 10$^{14}$ cm$^{-3}$. The results on Si were marginally lower, with μn of 173 cm2V$^{-1}$ s$^{-1}$ and μp of 47 cm$^2$V$^{-1}$s$^{-1}$, at a background carrier concentration of 2.5×10$^{15}$ cm$^{-3}$. Under 30 mW laser illumination, the carrier concentration increased to ~7.3× 10$^{15}$ cm$^{-3}$ (on graphene) and 3.1×10$^{15}$ cm$^{-3}$ (on Si). The carrier mobilities under illumination improved in both cases, but the NWs on graphene exhibited higher μn and μp values (248 cm$^2$/V-sec and 71 cm$^2$/V-sec, respectively) compared to NWs on Si (195 cm$^2$/V-s and 55 cm$^2$/V-s). The improved characteristics under illumination in NWs grown on graphene was due predominantly to the lower background carrier concentration and a slightly enhanced mobility.

Thus, the growth of high-quality GaAsSb NWs on graphene via the use of Sb as a surfactant for surface-engineering of the graphene has been demonstrated. The effect of the V/III BEP ratio on shifting the PL peak enabled preparation of photodetectors with improved performance in the telecommunication wavelength regime (1.3-1.55 μm) based on single NWs with a higher Sb composition as disclosed herein. The vertical GaAsSb NW density on graphene can be enhanced by wetting of the graphene surface, using different surface treatments or/and using a surfactant during the initiation of growth that modulates the contact angle of the droplet and limits the Ga adatom diffusion.

The two temperature growth steps with other growth optimization parameters and the surfactant effect of Sb were successfully used to realize GaAsSb NWs with a vertical orientation and reasonable density on monolayer graphene. Lowering the V/III BEP ratio led to higher Sb incorporation in the NWs. GaAs$_{1-x}$Sb$_x$ NWs grown under the conditions disclosed herein resulted in a sharp 4K PL emission peak at 0.94 μm (1.319 eV) with an FWHM of 46 meV and ~3-fold higher intensity as well as higher optical responsivity, generally attributed to a lower background carrier concentration with somewhat improved carrier mobilities compared to the NWs grown on a Si substrate, illustrating the high optical quality of the NWs.

Example 2

Monolayer graphene/SiO$_2$/p-Si(111) substrates were subjected to mild oxygen (O$_2$) plasma treatment by plasma etch, with radio frequency power varying from 1 W to 4 W and duration from 10 s to 45 s, under constant O$_2$ flow rate of 20 sccm at 200 mTorr pressure inside the chamber. Raman spectroscopy (Horiba Jobin Yvon ARAMIS Raman microscope with a He—Ne laser (633 nm) excitation source at room temperature) and X-ray photoelectron spectroscopy (XPS, thermoscientific ESCALAB Ti$^+$ and the peaks were fitted with Lorentzian function, performed by using the instrument analysis software) were used to characterize the defects induced in plasma treated graphene/SiO$_2$/p-Si (111) substrates.

After plasma treatment, the graphene substrates were baked under high vacuum in the intro chamber of MBE at temperatures ranging from 80° C. to 200° C. and for between 2 h and 8 h.

The growth of GaAs$_{1-x}$Sb$_x$ axial NWs on graphene or plasma treated graphene/SiO$_2$/p-Si (111) was carried out in a VEECO EPI 930 MBE system using As$_4$ and Sb$_2$ as Group V constituent sources. The growth was initiated at a growth temperature of 540° C. by opening the Ga, As and Sb shutters simultaneously. The growth temperature was immediately increased to 580° C. for a growth duration of 18 min. Ga, As, and Sb BEP of 1×10$^{-7}$, 1×10$^{-7}$, and 9×10$^{-7}$ Torr, respectively, at a V/III BEP ratio of 10 were used 10 minutes for the growth of stem, followed by growth of desired NW composition by changing the As and Sb BEP to 1.8×10$^{-6}$, and 2×10$^{-7}$ Torr, respectively, at a V/III BEP ratio of 20.

The resulting nanowires were characterized by SEM and PL spectra at 4K for the NWs showed a peak at 1.19 eV, and FWHM of 73 meV.

Characterization of Defects

To increase GaAsSb NW density on graphene (e.g. above 1.8 μm$^{-2}$) on monolayer graphene, point defects (e.g. sp$^3$ bonds) were introduced using mild oxygen plasma treatment of graphene with varied power and duration of treatment (Table 2). Defects on the graphene substrate were estimated to increase in I$_D$/I$_G$ compared to pristine graphene and decrease in 2D peak by Raman spectroscopy and chemical functionalization of graphene increase in sp$^3$ (C—C), C—O, C=O and COOH bond content by XPS.

TABLE 2

Sample preparation variations

| Sample | Power and duration of plasma treatment |
|---|---|
| 1 | Pristine |
| 2 | 1W, 16s |
| 3 | 1W, 45s |
| 4 | 2W, 10s |
| 5 | 2W, 16s |
| 6 | 2W, 25s |
| 7 | 3W, 16s |
| 8 | 4W, 16s |

Defects were induced in the sample 3 (1 W 45 s), sample 6 (2 W 25 s) and sample 8 (4 W 16s), confirmed by increase in $I_D/I_G$ compared to pristine. There was a direct relationship for defects induced in graphene with plasma duration and radio frequency (rf) power of treatment.

Example 3

Graphene was synthesized by a catalytic chemical vapor deposition (CVD) reaction on a 50 μm-thick Cu foil (CU 000495, 99.9%, Goodfellow, Coraopolis, Pa.)., following the method disclosed in Huet, B.; Raskin, J.-P.; Snyder, D. W.; Redwing, J. M. *Fundamental Limitations in Transferred CVD Graphene Caused by Cu Catalyst Surface Morphology*, Carbon 2020, 163, 95-104. The synthesis and transfer of monolayer graphene on $SiO_2$/p-Si(111) substrates were followed from Example 1. Some monolayer graphene/$SiO_2$/p-Si(111) substrates were subjected to mild $O_2$ plasma treatment (Plasma Etch, Inc., Carson City, Nev.) under a constant $O_2$ flow rate of 50 sccm at 200 mTorr pressure inside the chamber. Raman spectroscopy and XPS were used to characterize the defects induced in the plasma-treated graphene/$SiO_2$/p-Si (111) substrates. Raman spectroscopy of all samples under study (both graphene and NWs on graphene samples) was performed in a Horiba Jobin Yvon ARAMIS Raman microscope with a Nd:YAG laser (532 nm) excitation source at room temperature (RT). XPS was performed by using the Thermo Scientific ESCALAB Ti+, and the experimental peak positions of C1s spectra of graphene were determined from subtraction of the Shirley background fitting. Surface and conductive topography measurements of graphene were performed by tapping and contact modes, respectively, in an Asylum research atomic force microscope (AFM). Si probes were used at a resonant frequency of 190 kHz with an image scanning speed of 0.3 lines/s. The AFM probe was grounded, and the voltage was supplied to the substrate. A gold electrode was clamped on the surface of the substrate before conductive imaging.

After treatment, plasma-treated graphene substrates were baked under high vacuum (generally $1\times10^{-6}$ to $7\times10^{-7}$ Torr) in the load chamber of the molecular beam epitaxy (MBE) system at temperatures ranging from 80° C. to 200° C. and from 2 h to 8 h to yield defects contributing to the growth of high-density vertical NWs. A VEECO EPI 930 MBE system was used for the growth of these $GaAs_{1-x}Sb_x$ axial NWs on pristine graphene or plasma-treated graphene/$SiO_2$/p-Si (111). $As_4$ and $Sb_2$ fluxes were used as Group-V constituent sources. Growth was initiated by opening the Ga, As, and Sb shutters simultaneously at 540° C., which was immediately increased to a growth temperature of 580° C. for a growth duration from 18 to 48 min. Group V/III beam equivalent pressure (BEP) ratios of 10 and 20 were used, respectively, for the stem and top GaAsSb segments. A Ga BEP of $1\times10^{-7}$ Torr corresponding to 0.5 ML/s growth rate of a GaAs thin film was used. The GaAs passivation layer was grown for 2 min by the vapor-solid technique at 465° C. and a V/III BEP ratio of 20. Before passivation, the droplet was consumed by opening the As shutter at a BEP of $1.8\times10^{-6}$ Torr for 3 min. The n-doping of the NW was performed during the growth process using a GaTe-effusion cell maintained at a temperature of 550° C.

Scanning electron microscopy (SEM) was performed using a Carl Zeiss Auriga-BU FIB field emission scanning electron microscope (FESEM). Samples for high-resolution transmission electron microscopy (HRTEM), energy-dispersive X-ray spectroscopy (EDS), and selected area electron diffraction (SAED) were prepared by scraping the surface of a field of prepared nanowires and gently placing a lacey carbon Cu grid over the surface. NWs were attached to the grid via electrostatic interactions and then imaged. To image a graphene/NW interface, a Thermo Fisher FEI Quanta 3D focused ion beam (FIB) was used for the sample preparation of cross-sections. Candidate wires were located using the FESEM of the Quanta. A 200 nm layer of electron beam deposited Pt was used to cover the wire of interest. Since the sample was protected by the thin layer of Pt, a thicker layer of Pt (2 μm) was deposited on top to protect the site of interest so that the thinning process could proceed. The sample was initially thinned with a 16 kV Ga ion beam to electron transparency and further ion polished with a 5 kV ion beam to obtain a section that was <100 nm thick. Imaging, SAED, and EDS were performed on a Thermo Fisher Talos F200X 80-200 kV S/TEM operated at 200 kV. The Sb concentration from EDS was assessed using standard k-factor methods in the Velox software. The estimated Sb concentration by EDS was in agreement with that determined by EDS in the SEM.

Optical measurements included μ-photoluminescence (μ-PL) using a 633 nm He—Ne laser as the excitation source with a 0.32 m double grating monochromator for wavelength dispersion and an InGaAs detector for detection using conventional lock-in amplifier techniques. A closed-cycle optical cryostat from Montana Cryostation with the sample chamber interfaced with a fiber-coupled confocal microscope was used for μ-PL measurements at 4 K. For ensemble devices, NWs/graphene samples were spin-coated with insulating and transparent poly(methyl methacrylate) (PMMA), which served as both a protective layer and filler for NWs. Oxygen plasma treatment followed by chemical etching was used to expose the NW core tips for contact. Metal contacts for the NW device consisted of Au/Ti (200/20 nm) and Au (200 nm) depositions for top contacts and graphene, respectively. The photoresponse of the photodetector (PD) device was performed using two-probe electrical measurements under optical illumination, using a Horiba microHR (LSH-T250) spectrometer for wavelength dispersion, with a tungsten-halogen lamp as the excitation source and a Keithley-4200 electrical source meter. The detector was illuminated through a monochromator on the tip of the NWs. The illuminated beam spot size (20 $mm^2$) was larger than the active area of the sample, so light transmited to the NW through the sidewalls. Low-frequency noise (LFN) measurements were conducted by dc-biasing of the metal electrodes of the ensemble device, and using a fast Fourier transform dynamic signal analyzer.

Results and Discussion

NW Growth on Graphene

The growth of a stem with an increased Sb composition (x>0.1) for 10 min growth duration (sample A) was examined using the two-step growth temperature (540° C./580°

C.) process described in the experimental details. A V/III BEP ratio of 10 was used for stem growth. A short stem growth was observed, but the droplet size at the tip appeared unusually large, wetting the side facets and migrating onto the sidewalls. Without being bound by theory the enlargement of the droplet may be attributed to the imbalance in surface energy caused by the Sb surfactant effect, which lowers the chemical potential of the droplet as well as decreases the diffusion length of adatoms. To reduce the influence of Sb on the droplet, the growth duration of the GaAsSb (x>0.1) stem was reduced to 4 min, followed by the growth of $GaAs_{1-x}Sb_x$ NW (x=0.1) segment (sample B). This change resulted in the successful growth of low density well-faceted NWs of vertical alignment along with crawling NWs. Reducing Sb exposure time modulated the critical droplet contact angle at the NW tip. The EDS-SEM measurement revealed the Sb content in the samples A and B to be ~45% and ~37%, respectively. The vertical NW density of the sample was too low for many applications. With a goal of increasing the NW density, the graphene surface was treated with mild $O_2$ plasma to create more surface defects. The growth recipe of sample B with the shorter stem of GaAsSb yielded higher vertical NW density and was adopted for all the following growth on plasma-treated graphene.

Effects of Plasma Treatment

Low radio frequency (RF) power from 1 to 4 W and 10-45 s duration of the $O_2$ plasma treatment on graphene/$SiO_2$/p-Si (111) were employed. Low plasma power with minimal exposure duration minimized adverse impact of $O_2$ plasma treatment of graphene on its surface etching and electronic properties. The defects created on the graphene surface by post-$O_2$ plasma treatment were assessed by Raman spectroscopy. Pristine graphene exhibited Raman modes for the 2D and G peaks at ~2679 $cm^{-1}$ and ~1587 $cm^{-1}$, respectively. The peak intensity ratio (~2) for 2D to G Raman mode peaks was indicative of monolayer graphene. Mild plasma treatment did not substantially alter the peak positions of Raman mode (2D, G, and D) on any of the samples, although the intensities of all Raman modes varied with a change in plasma power and duration. Even for the lowest RF plasma power and shortest duration treatment, disorder was induced on the surface of graphene, as evidenced by the rise in intensity of the D peak compared to pristine graphene. The data pointed to the creation of a low defect concentration, similar to those commonly observed in nanocrystalline graphene; and to the nature of the defects being point defects created in the $sp^2$ lattice of graphene. Data from samples that had RF power and duration of 1 W, 45 s, and 2 W, 25 s were attributed to the dominance of $O_2$ related functional groups on the graphene surface.

AFM and C-AFM were used to evaluate $O_2$ plasma treatment induced modifications in surface morphology and conductivity of the graphene surface. AFM surface topography image of the pristine graphene showed the wrinkle-free smooth surface of graphene on $SiO_2$/p-Si (111) with a measured RMS roughness of ~0.35 nm, which increased in the plasma-treated sample (1 W, 45 s) to an RMS roughness of ~0.67 nm. This was corroborated with a conductive topography map, where the average current distribution of 100 nA observed in pristine graphene declined to 30 nA in the plasma-treated NW sample, showing that even mild plasma treatment modified the surface morphology of the graphene surface. Without being bound by theory, the increase in roughness and decrease in conductivity due to a reduction in the mobility of carriers were likely due to induced $O_2$ functional groups on the graphene surface, indicating even mild $O_2$ plasma treatment of pristine graphene is sufficient for successful surface modifications of the substrate that greatly influences the transport properties of the graphene.

XPS studies probed the nature of $O_2$ plasma treatment-induced chemical functional groups on pristine graphene. During the $O_2$ plasma process, PMMA residue was etched away concomitantly with the introduction of defects in graphene. The data show peaks attributable to $O_2$ plasma treatment, C—O and COOH groups, both functional groups that enhance the wettability of graphene and enable reshaping of the Ga droplet by varying the contact angle to the desired one. Plasma treatment of the graphene surface, even at low power and short duration, can impact nucleation center density and orientation of the grown NWs.

Nanowire Growth on Plasma Treated Graphene

Growth of the axial $GaAs_{1-x}Sb_x$ (x>0.1)/$GaAs_{1-x}Sb_x$ (x=0.1) stem NWs on plasma-treated graphene/$SiO_2$/p-Si (111) used the growth steps outlined above for sample B. In the MBE system, all substrates prior to growth were typically prebaked at 200° C. for 8 h in ultra-high vacuum to prevent any contamination of the MBE growth chamber, which was also continued for the plasma-treated graphene. Two variants of plasma-treated graphene at 2 W, 25 s and 1 W, 45 s were chosen for the NW growth study, although NW growth was observed on the 2 W, 25 s (sample C). The prebake temperature and its duration were reduced from 200° C. to 80° C. and 8 h to 2 h for the plasma pretreated sample using 2 W, 25 s (sample D), to minimize adverse impact of temperature. This resulted in randomly aligned NWs with minimal parasitic growth and droplets. The next set of growth conditions used even milder plasma-treatment conditions (1 W, 45 s (sample E)) with the same prebaking conditions (80° C. and 2 h) of the substrate. NWs of vertical orientation and an average length of ~610 nm at an axial growth rate of 33.8 nm/min were grown (sample E). These results demonstrate that low damage plasma conditions can be tuned to vary the density of disorder and C—O and COOH functional groups on the graphene surface, while the use of low pre-growth substrate baking temperature and duration preserve surface modifications. Control of the surface energy and wettability of graphene promotes NW growth in a vertical configuration. Mild $O_2$ plasma treatment of graphene surface improved vertical NW density, as shown by the increased NW density from ~0.4 $\mu m^{-2}$ (sample B) to ~4 $\mu m^{-2}$ (sample E). The growth of nanowires without a high Sb composition stem resulted in low NW density. Table 3 lists the NW sample terminology and related growth conditions.

TABLE 3

$O_2$ Plasma treatment of graphene and relevant growth conditions for different $GaAs_{0.6}Sb_{0.4}$ stem/$GaAs_{0.9}Sb_{0.1}$ NWs grown on pristine and on plasma-treated graphene/$SiO_2$/p-Si (111) substrate

| Sample | Plasma power (W) and time (s) | Pre-bake temp (° C.) and time (h) | Stem growth time (min) | NW growth time (min) |
|---|---|---|---|---|
| A | — | 200° C. 8 h | 10 | — |
| B | — | 200° C. 8 h | 4 | 5 |
| C | 2 W 25s | 200° C. 8 h | 8 | 10 |
| D | 2W 25s | 80° C. 2 h | 8 | 10 |
| E | 1W 45s | 80° C. 2 h | 8 | 10 |

The growth duration of the top GaAsSb (x=0.1) segment was increased and the length of the NW increased (sample F, average length 870+/−5 nm). The axial growth rate diminished with longer growth durations to a reported maximum of ~890 nm. Without being bound by theory, the absence of a Ga droplet and axial growth rate reduction was consistent with early consumption of the droplet and termination of the axial growth with all the flux contributing to the 2D parasitic growth.

Surface Passivation and N-Doping of Nanowires

A PD device generally requires suppression of surface effects and doping of NWs. The NWs were passivated using a GaAs passivation layer after consuming the droplet of the $GaAs_{1-x}Sb_x$ NW and carrying out growth of the passivation layer, GaAs, at a lower growth temperature of 465° C. for 2 mins duration (sample G). The growth of the passivation layer increases the NW diameter by ~5 nm at the expense of parasitic growth and improved optical properties, confirming the successful formation of the passivation layer.

Figure 7B:
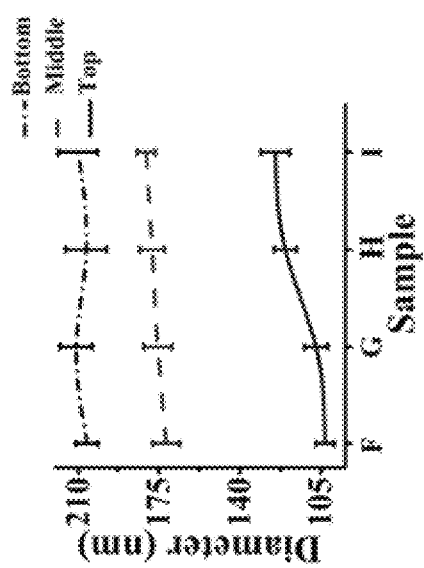
FIG. 7B shows a plot of diameter at different segments of sample F (GaAs$_{0.6}$Sb$_{0.4}$/GaAs$_{0.9}$Sb$_{0.1}$ NWs), sample G (GaAs-passivated GaAs$_{0.6}$Sb$_{0.4}$/GaAs$_{0.9}$Sb$_{0.1}$NWs), sample H (Te-doped GaAs$_{0.6}$Sb$_{0.4}$/GaAs$_{0.9}$Sb$_{0.1}$ NWs), and sample I (GaAs-passivated Te-doped GaAs$_{0.6}$Sb$_{0.4}$/GaAs$_{0.9}$Sb$_{0.1}$ NWs each grown on O$_2$ plasma treated graphene). Each data point represents the mean value of 200 NWs and error bar denotes the range of measured values.
Figure 7A:
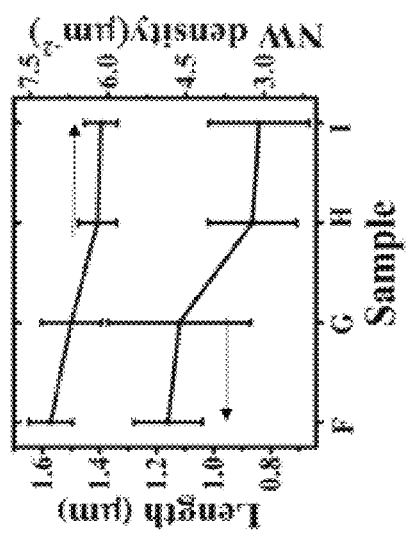
FIG. 7A illustrates a plot of length (solid line) and NW density (dotted line) of sample F (($GaAs_{0.6}Sb_{0.4}$/$GaAs_{0.9}Sb_{0.1}$ NWs), sample G (GaAs-passivated ($GaAs_{0.6}Sb_{0.4}$/$GaAs_{0.9}Sb_{0.1}$ NWs), sample H (Te-doped $GaAs_{0.6}Sb_{0.4}$/$GaAs_{0.9}Sb_{0.1}$NWs), and sample I (GaAs-passivated Te-doped $GaAs_{0.6}Sb_{0.4}$/$GaAs_{0.9}Sb_{0.1}$NWs each grown on $O_2$ plasma treated graphene), respectively. Each data point represents the mean value of 200 NWs and error bar denotes the range of measured values. Length was measured from substrate to tip of the NWs and NW density was calculated by taking all the NWs protruding outside the parasitic growth.

NW of GaAsSb not intentionally doped generally exhibit p-type conductivity due to inherent defects, as disclosed herein. N-doping of the top segment of $GaAs_{1-x}Sb_x$ (x=0.1) NW was made. The tellurium (Te) doped NWs (sample H) using a GaTe cell exhibited smoother sidewall morphology and less tapered NWs compared to intrinsic ones; without being bound by theory, this is attributed to a Te terminated surface and Ga—Te binding on the surface leading to enhanced adatom adsorption rate. Sample I represents the passivated layer configuration of Te-doped NWs of sample H. A reduction in NW density was observed due to increased parasitic growth, which covered the short NWs. These observed changes in NW density and geometry are summarized graphically (FIGS. 7A and 7B) and Table 4 lists the plasma-treated samples.

TABLE 4

Configurations of $GaAs_{0.9}Sb_{0.1}$ NW grown on 1 W, 45s $O_2$ plasma treated graphene, where "/GaAs" indicates a GaAs passivating layer and "(Te)" indicates a tellurium dopant

| Sample | NW configuration "stem/upper region" |
|---|---|
| F | $GaAs_{0.6}Sb_{0.4}/GaAs_{0.9}Sb_{0.1}$ |
| G | $(GaAs_{0.6}Sb_{0.4}/GaAs_{0.9}Sb_{0.1})/GaAs$ |
| H | $GaAs_{0.6}Sb_{0.4}/GaAs_{0.9}Sb_{0.1}$ (Te) |
| I | $(GaAs_{0.6}Sb_{0.4}/GaAs_{0.9}Sb_{0.1}$ (Te)/GaAs |

Sample G was examined spectroscopically by TEM, HRTEM and corresponding SAED patterns at different segments of the NW. The zinc-blende (ZB) structure of the grown NW was confirmed. The NW lacked stacking faults and twins, indicating the structural quality of the NWs of the present disclosure, namely, defect-free GaAsSb NWs grown on graphene. The thickness of the GaAs passivation layer was estimated to be ~3 nm from the HRTEM image. High-angle annular dark-field scanning TEM (HAADF STEM) imaging with overlaid EDS maps and analogous compositional line scans showed uniform compositional homogeneity radially along the NW segments.

Sample I was examined spectroscopically by TEM image, HRTEM and SAED at different segments of the NW, which confirmed the ZB crystal structure. The HRTEM image and presence of satellite spots in the corresponding SAED patterns indicated the presence of twin boundaries over ~20 nm and ~30 nm length of the top and bottom segments, respectively, of the NW. Without being bound by theory, formation of twins in the top segment was likely due to modulation in NW diameter based on incorporation of Te in the host lattice, as well as the surfactant nature of Te. The creation of twins at the bottom segment of the NW may have occurred due to the non-uniform formation thickness of the passivation layer. False-color EDS mapping and respective compositional line scans demonstrate the uniform compositional homogeneity along the radial direction of the NW segments. Due to the resolution limit of EDS in the TEM, dopant (Te here) concentrations on the order of $10^{18}/cm^3$ were not quantifiable. The cross-sectional HRTEM image at the NW-substrate interface of sample I confirmed the presence of $O_2$ plasma-treated graphene at the interface.

Figure 8B:
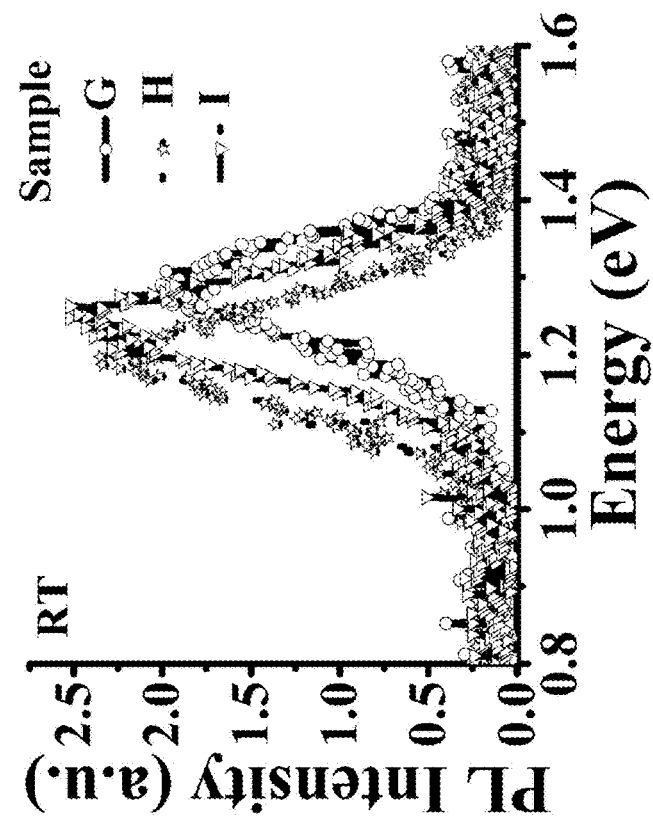
FIG. 8B illustrates room temperature PL spectra of NWs grown on O$_2$ plasma-treated graphene of sample F (GaAs$_{0.6}$Sb$_{0.4}$/GaAs$_{0.9}$Sb$_{0.1}$ NWs), sample G (GaAs-passivated GaAs$_{0.6}$Sb$_{0.4}$/GaAs$_{0.9}$Sb$_{0.1}$ NW), sample H (Te-doped GaAs$_{0.6}$Sb$_{0.4}$/GaAs$_{0.9}$Sb$_{0.1}$ NWs), and sample I (GaAs-passivated Te-doped GaAs$_{0.6}$Sb$_{0.4}$/GaAs$_{0.9}$Sb$_{0.1}$) NWs.
Figure 8A:
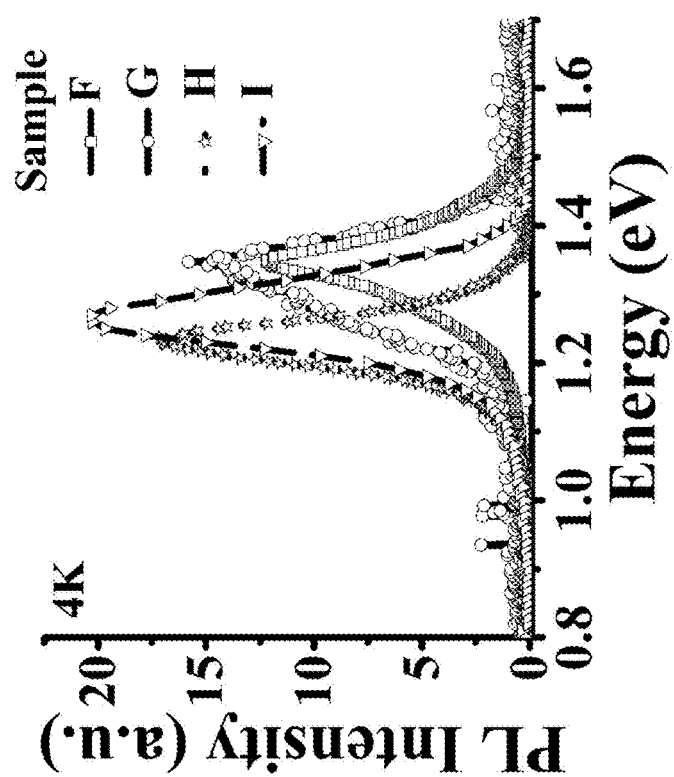
FIG. 8A illustrates 4K PL spectra of NWs grown on O$_2$ plasma-treated graphene of sample F (GaAs$_{0.6}$Sb$_{0.4}$/GaAs$_{0.9}$Sb$_{0.1}$ NWs), sample G (GaAs-passivated GaAs$_{0.6}$Sb$_{0.4}$/GaAs$_{0.9}$Sb$_{0.1}$ NW), sample H (Te-doped GaAs$_{0.6}$Sb$_{0.4}$/GaAs$_{0.9}$Sb$_{0.1}$ NWs), and sample I (GaAs-passivated Te-doped GaAs$_{0.6}$Sb$_{0.4}$/GaAs$_{0.9}$Sb$_{0.1}$) NWs.

PL spectra at 4K, and at room temperature (RT), of all samples grown on plasma-treated graphene surfaces, including GaAsSb and Te-doped GaAsSb NWs with and without the passivation layers (samples F, G, H and I) were plotted (FIGS. 8A and 8B). The 4K PL peak intensity increased from sample F to G to H to I (1.26 eV), and the RT peak intensity followed the same order, with the PL signal in sample F not detected (weak signal). No significant 4K PL peak shift was observed between the intrinsic core (1.35 eV) and passivated layer (1.35 eV), nor between the Te-doped core (1.23 eV) and axial NW with passivated layer configuration (1.26 eV), both of which are evidence of efficient passivation of surface states by the GaAs layer. The Te-doped samples exhibited a red-shift of ~120 meV with respect to the intrinsic sample at 4K. The GaAs passivation led to a slight blue shift in PL peak of the sample I, compared to H. The increase in PL and red-shift in Te doped samples may confirm n-type doping leading to compensation of defects and broadening of donor levels leading to the donor to acceptor transitions at lower energy.

The NWs were also characterized by Raman spectra to evaluate the NW growth induced modifications of plasma-treated graphene. Lack of any shifts in the Raman peak positions of G and D modes, before and after nanowire growth, attest to the presence of graphene, while the invariant intensity of the disorder peak (D mode) suggest absence of any additional defects induced on the graphene surface. The existence of graphene was corroborated with a cross-sectional HRTEM image at the NW-substrate interface of sample I. However, a blueshift of ~2 $cm^{-1}$, and an increase in FWHM of the Raman 2D peak from ~61 $cm^{-1}$ to ~76 $cm^{-1}$ observed on graphene, post-NW growth, suggest growth induced strain on the graphene surface.

All NW samples exhibited three more Raman peaks at ~231 $cm^{-1}$, ~260 $cm^{-1}$ and ~280 $cm^{-1}$, which correspond to the GaSb-like transverse optical (TO) mode, GaAs-like TO mode and GaAs-like longitudinal optical (LO) mode. Reduction in the ratio of the intensity of LO and TO mode for samples G, H and I, compared to intrinsic sample F, implies a narrowing of the surface depletion layer width, which is consistent with the increased intensity observed in PL.

Ensemble Photodetector Device

Figure 9A:
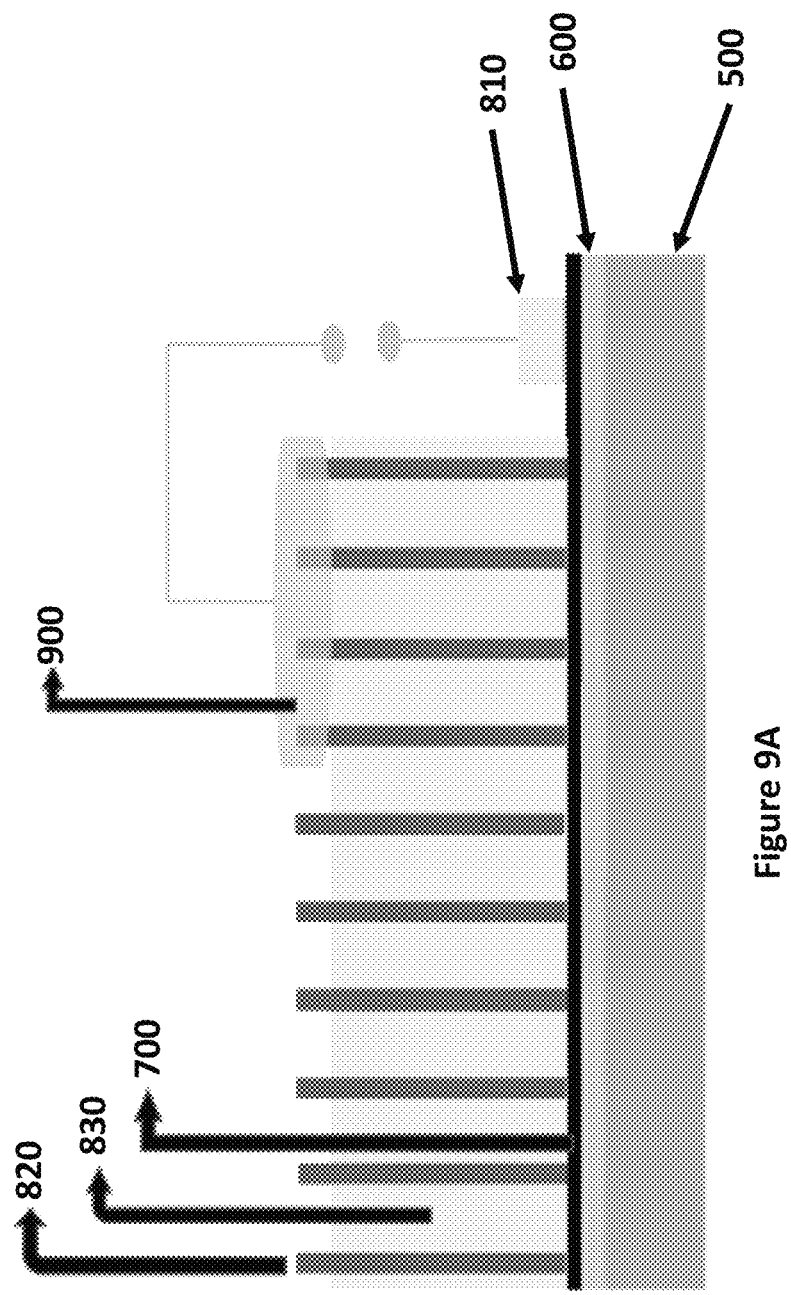
FIG. 9A illustrates a schematic of ensemble GaAsSb NWs/O$_2$ plasma-treated graphene device.

The optoelectronic properties of the GaAs passivated $GaAs_{0.6}Sb_{0.4}/GaAs_{0.9}Sb_{0.1}$NWs (sample G), and Te-doped $GaAs_{0.6}Sb_{0.4}/GaAs_{0.9}Sb_{0.1}$ NWs (sample I) grown on plasma-treated graphene were investigated, using a representative ensemble device (FIG. 9A), wherein the plasma treated graphene, 700, was laid on top of a $SiO_2$ layer, 600, supported on a p-Si(111) layer, 500. The GaAsSb NW, 820, were surrounded by polyimide, 830, and topped with an Au pad, 900, which was operatively engaged with an Au contact, 810.

Figure 9C:
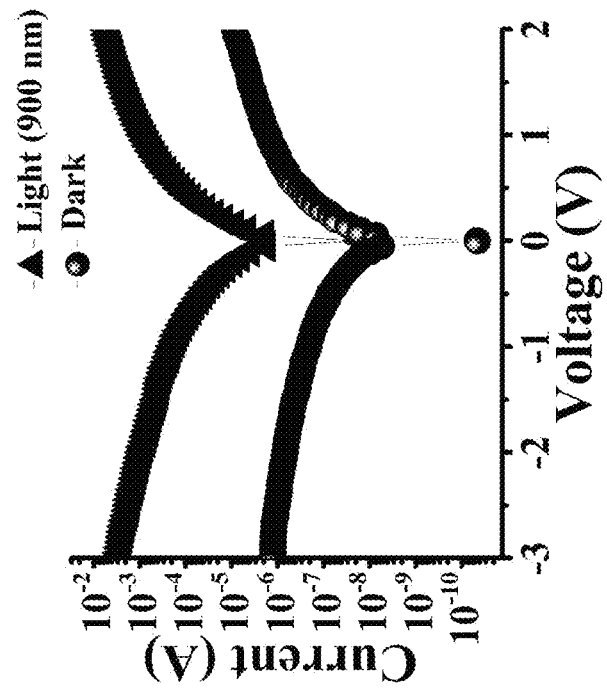
FIG. 9C illustrates logarithmic plot of RT I-V under dark and 900 nm laser illumination conditions of sample I (GaAs-passivated Te-doped GaAs$_{0.6}$Sb$_{0.4}$/GaAs$_{0.9}$Sb$_{0.1}$ NWs grown on O$_2$ plasma treated graphene).
Figure 9B:
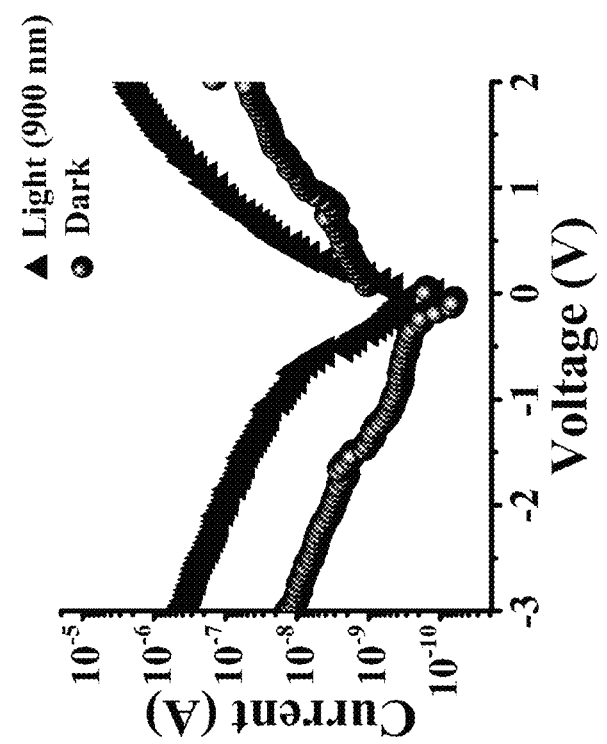
FIG. 9B illustrates logarithmic plot of RT I-V under dark and 900 nm laser illumination conditions of sample G (GaAs-passivated GaAs$_{0.6}$Sb$_{0.4}$/GaAs$_{0.9}$Sb$_{0.1}$ NWs grown on O$_2$ plasma treated graphene).

The I-V characteristics of these samples under dark and 900 nm illumination conditions were measured (FIGS. 9B and 9C). Under dark condition, sample G exhibited a double Schottky junction. The work function of intrinsic graphene is ~4.5 eV, while that of GaAsSb was expected to be >4.7 eV.

The effect of $O_2$ plasma treatment on the work function on the graphene was expected to be marginal, based on the 0.8 eV increase reported for 60 W plasma treatment of graphene. This explains the Schottky characteristic at the GaAsSb and graphene interface, whereas the top contact with intrinsic GaAsSb is typically a Schottky one. Under dark condition, sample I displayed rectifying behavior with a rectification ratio (I forward/I reverse) of ~29 at a bias of −3 V. This clearly affirms the realization of n-doping in the top GaAsSb segment of the NW, thereby forming a p-n junction with the intrinsic GaAsSb (x=0.4) stem at the bottom. Estimated carrier concentration, electron and hole mobility of Te-doped NWs (sample I) under dark condition were $\sim 3 \times 10^{18}$ cm$^{-3}$, ~530 cm$^2$/(V s) and ~100 cm$^2$/(V s). Carrier concentration and mobility were estimated using finite element modeling of the NW (COMSOL Multiphysics software) from the best fit of the simulated data to the experimental I-V characteristics.

Figure 9E:
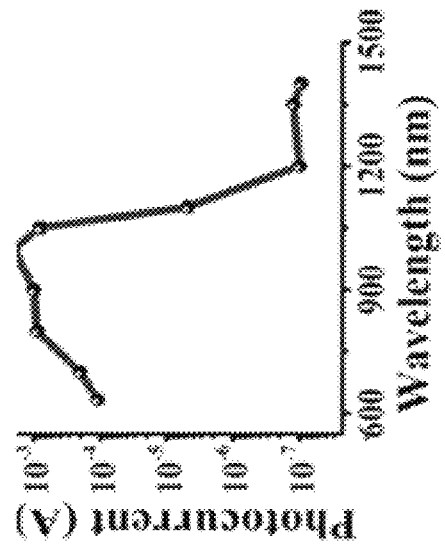
FIG. 9E illustrates the wavelength dependence of photocurrent at an applied bias of −2 V of sample I (GaAs-passivated Te-doped GaAs$_{0.6}$Sb$_{0.4}$/GaAs$_{0.9}$Sb$_{0.1}$ NWs grown on O$_2$ plasma treated graphene).
Figure 9D:
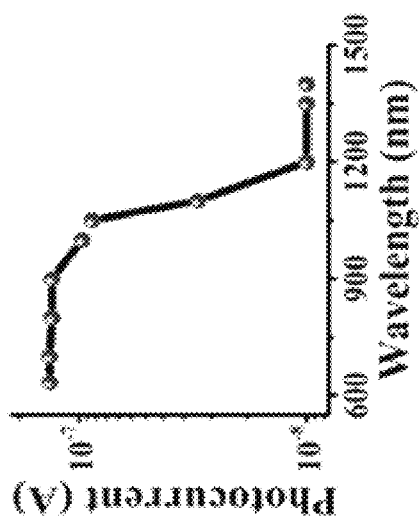
FIG. 9D illustrates the wavelength dependence of photocurrent at an applied bias of −2 V of sample G (GaAs-passivated GaAs$_{0.6}$Sb$_{0.4}$/GaAs$_{0.9}$Sb$_{0.1}$ NWs grown on O$_2$ plasma treated graphene).

Under 900 nm illumination at an applied bias from −3 V to 2 V, sample I exhibited ~3 orders of magnitude higher photocurrent at a bias of −1 V, compared to sample G. Without being bound by theory, this can be attributed to the higher carrier concentration in Te-doped NWs, and successful separation of photoexcited electron-hole pairs at the junction. Near infrared (NIR) photodetector (PD) device performance is typically measured by responsivity (RA), noise equivalent power (NEP) and specific detectivity (D*), which are calculated in the following equations:

$$R(\lambda) = \frac{(I_p - I_d)}{P} (AW^{-1}) \quad (1)$$

$$NEP = \frac{\sqrt{\langle i_n \rangle^2}}{R_\lambda} = \frac{\sqrt{S_I[\ln(B)+1]}}{R_\lambda} \quad (2)$$

$$D^* = \frac{\sqrt{A*B}}{NEP} \quad (3)$$

where $I_p$ is the photocurrent, $I_d$ is the dark current, P is the incident light illumination power (~40 µW), λ (900 nm) is the wavelength of the illuminated light, A is the active area (0.78 mm$^2$; which was taken to be the area of the top metal contact pad), $\langle i_n \rangle^2$ is the total noise square current, $S_I$ the power spectral density and B is the bandwidth. Using the above equations, $R_\lambda$ at a bias of −1 V were ~16 mA/W and ~110 A/W for samples G and I, respectively, and the corresponding experimental values of $S_I$ at f=10 Hz were $5.32 \times 10^{-21}$ A$^2$Hz$^{-1}$ and $1.73 \times 10^{-16}$ A$^2$Hz$^{-1}$, respectively. The low frequency noise (LFN) spectrum of the ensemble device made of sample I taken at 1V reverse bias exhibited a 1/f trend from 10-110 Hz. The responsivity of sample I was of the same order of magnitude as ensemble p-i ensemble GaAsSb/AlGaAs core-shell NWs grown on p-Si (111), but was 10× lower than horizontal GaAsSb single NW grown on Si (111). The calculated values of NEP for B=100 Hz at a bias of −1 V for samples G and I were $1.1 \times 10^{-8}$ W and $2.8 \times 10^{-11}$ W, respectively, with the corresponding estimated D* to be $4 \times 10^{10}$ Jones and $1.1 \times 10^{14}$ Jones. The detectivity of sample I was on par with the highest D* reported for a NW photodetector. Spectral response of photocurrent at a bias of −2 V for samples G and I (FIGS. 9D and 9E), respectively, shows that a sharp decrease in response began at ~0.9 µm and ~1 µm, respectively, which correlate well with the PL peak wavelengths of the two samples.

As shown herein, mild $O_2$ plasma treatment was used for surface engineering of a monolayer graphene surface to enhance the growth and orientation of GaAsSb semiconductor NWs. Further shown herein is demonstration of an effective junction device. As shown herein, mild $O_2$ plasma treatment of monolayer graphene provides controlled manipulation of GaAsSb NW density and orientation. A combination of a high Sb concentration for the GaAsSb stem at the nucleation step for the surface engineering of Sb on the graphene surface and lattice matching and surface modifications by a mild plasma treatment of graphene leads to good vertical NW density (~7 µm$^{-2}$). A room temperature photoluminescence signal at 1.3 eV obtained in Te-doped NWs with a GaAs passivated layer demonstrates the high quality of the grown NWs. An ensemble NW photodetector in a passivated axial configuration with a responsivity of 110 A/W and detectivity of ~10$^{14}$ Jones has been demonstrated.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A composition comprising at least one nanowire formed from $GaAs_{1-x}Sb_x$,
   wherein the at least one nanowire is grown on a graphitic substrate, and
   wherein the at least one nanowire is an axial nanowire comprising:
   a stem region wherein x is between 0.3 and 0.5; and
   an upper region wherein x is between 0.05 and 0.2.

2. The composition according to claim 1, wherein the nanowire exhibits an average 4K photoluminescence emission of at least about 1.24 eV.

3. The composition according to claim 1, wherein the nanowire exhibits an average room temperature PL emission of at least about 1.25 eV.

4. The composition according to claim 1, wherein the at least one nanowire is a plurality of nanowires that is present in an array of nanowires.

5. The composition according to claim 4, wherein all or substantially all of the nanowires are vertically aligned or substantially vertically aligned in the array.

6. The composition according to claim 1, wherein the nanowires have an average diameter of from 50 nm to 400 nm.

7. The composition according to claim 1, wherein the nanowires have an average length of from 50 nm to 10 µm.

8. The composition of claim 1, wherein the upper region contains an n-dopant.

9. The composition of claim 8, wherein the n-dopant is tellurium.

10. The composition of claim 1, wherein the graphitic substrate is graphene or a derivative thereof.

11. The composition of claim 1, wherein the axial nanowire has a passivating layer.

12. The composition of claim 11, wherein the passivating layer comprises GaAs.

13. An optoelectronic device comprising at least one nanowire formed from $GaAs_{1-x}Sb_x$,
   wherein the at least one nanowire is grown on a graphitic substrate, and
   wherein the at least one nanowire is an axial nanowire comprising:
   a stem region wherein x is between 0.3 and 0.5; and
   an upper region wherein x is between 0.05 and 0.2.

14. A method of preparing a plurality of $GaAs_{1-x}Sb_x$ nanowires on a graphitic substrate, comprising the steps of:
   a. subjecting a graphitic substrate to a plasma treatment;
   b. baking the plasma treated graphitic substrate;
   c. performing a molecular beam epitaxy using a flux of Ga atoms, to create a plurality of Ga droplets; and
   d. performing a molecular beam epitaxy using fluxes of each of Ga, As and Sb atoms, to grow a plurality of nanowire structures including $GaAs_{1-x}Sb_x$,
      wherein each $GaAs_{1-x}Sb_x$ nanowire structure is an axial nanowire comprising:
         a stem region wherein x is between 0.3 and 0.5; and
         an upper region wherein x is between 0.05 and 0.2.

15. The method of claim 14,
   wherein each of the nanowire structures is an axial nanowire structure, and
   wherein the molecular beam epitaxy growth occurs during a first and a second stage.

16. The method of claim 15,
   wherein the first stage is conducted at a temperature of between 500° C. and 550° C., and
   wherein the second stage is conducted at a temperature of between 575° C. and 615° C.

17. The method according to claim 14, wherein substantially all of the nanowire structures are oriented vertically on the graphitic substrate.

18. The method according to claim 14, wherein the graphitic substrate is graphene or a derivative thereof.

19. The method according to claim 14, wherein the graphitic substrate is baked at a temperature ranging from 80° C. to 200° C., for 2 to 8 hours.

20. The method according to claim 14, wherein the method further includes the step of growing a passivating layer on all or substantially all of the nanowire structures.

21. The method according to claim 14, further including the step of n-doping the upper region of the nanowire structure.

22. The method according to claim 14, wherein the plurality of nanowire structures on the graphitic substrate have a density of at least 1.8 $\mu m^{-2}$.

23. The method of claim 14, wherein the plasma treatment is an oxygen plasma treatment.

* * * * *